(12) United States Patent
Sagawa et al.

(10) Patent No.: US 8,184,075 B2
(45) Date of Patent: May 22, 2012

(54) ACTIVE MATRIX DISPLAY DEVICE

(75) Inventors: Hiroshi Sagawa, Kanagawa (JP);
Takayuki Taneda, Kanagawa (JP);
Tetsuro Yamamoto, Kanagawa (JP);
Junichi Yamashita, Tokyo (JP);
Katsuhide Uchino, Kanagawa (JP);
Yukihito Iida, Kanagawa (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 874 days.

(21) Appl. No.: 12/261,613

(22) Filed: Oct. 30, 2008

(65) Prior Publication Data

US 2009/0115708 A1    May 7, 2009

(30) Foreign Application Priority Data

Nov. 1, 2007  (JP) ................................. 2007-285095
Mar. 20, 2008  (JP) ................................. 2008-072682

(51) Int. Cl.
*G09G 3/20* (2006.01)
(52) U.S. Cl. ...................................... 345/76; 315/169.3
(58) Field of Classification Search .................... 345/55, 345/76, 77, 82; 315/169.1, 169.3; 313/500
See application file for complete search history.

(56) References Cited

U.S. PATENT DOCUMENTS

| 6,661,396 B2* | 12/2003 | Yabuki ............................. 345/76 |
| 6,847,338 B2* | 1/2005 | Abe et al. ......................... 345/60 |
| 7,434,940 B2* | 10/2008 | Allman et al. ................... 353/85 |

FOREIGN PATENT DOCUMENTS

| EP | 0458173 | 11/1991 |
| JP | 2000-241833 | 9/2000 |
| JP | 2002-229480 | 8/2002 |
| JP | 2004-347891 | 12/2004 |
| JP | 2006-058815 | 3/2006 |
| JP | 2007-156015 | 6/2007 |

OTHER PUBLICATIONS

Japanese Patent Office Action corresponding to Japanese Serial No. 2008-072682 dated Sep. 29, 2009.

\* cited by examiner

*Primary Examiner* — Abbas Abdulselam
(74) *Attorney, Agent, or Firm* — SNR Denton US LLP

(57) ABSTRACT

An active matrix display device includes a driving section provided on a substrate, an insulating film stacked on the substrate, and light-emitting elements arranged in a matrix on the insulating film, and each of the light-emitting elements includes an light-emitting layer between its upper and lower electrodes, the active matrix display device being driven by the driving section provided for each of the light-emitting elements, the active matrix display device also including a first wiring required to cause the light-emitting element to emit light, and a second wiring disposed in the underlying layer of the first wiring via the insulating film, the second wiring also required to cause the light-emitting element to emit light, wherein the first or second wiring is branched into a plurality of wirings at the intersection between the two wirings.

22 Claims, 18 Drawing Sheets

[INTERSECTION A]

[INTERSECTION A]

[INTERSECTION B]

[INTERSECTION B]

[INTERSECTION C]

[a-a' CROSS SECTION]

[INTERSECTION C]

[INTERSECTION D]

[INTERSECTION E]

[INTERSECTION F]

[INTERSECTION E]

[INTERSECTION F]

[INTERSECTION G]

[INTERSECTION H]

[INTERSECTION G]

[INTERSECTION H]

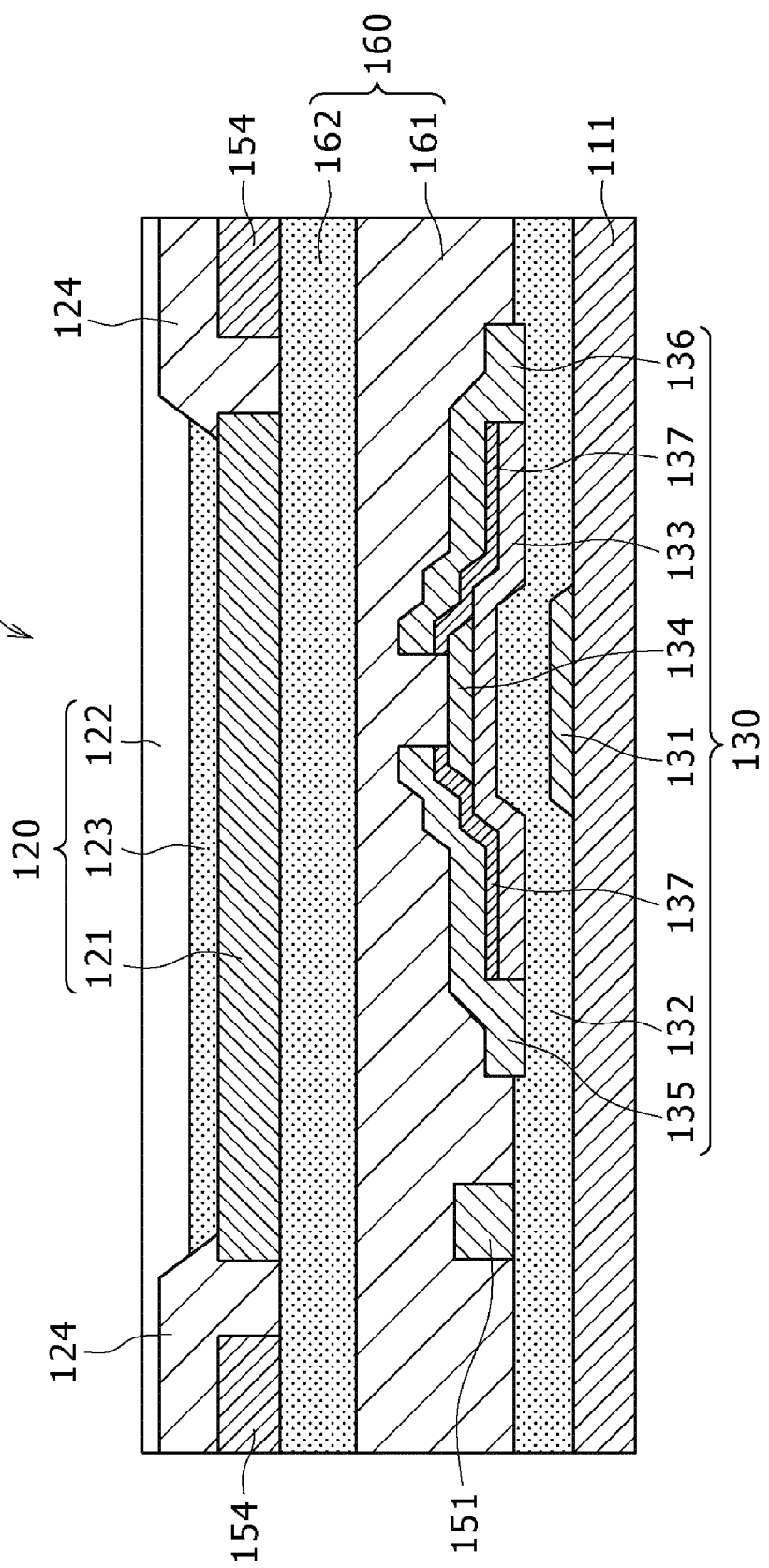

ACTIVE MATRIX DISPLAY DEVICE

CROSS REFERENCES TO RELATED APPLICATIONS

The present invention contains subject matter related to Japanese Patent Application JP 2007-285095 and JP 2008-072682 both filed in the Japan Patent Office on Nov. 1, 2007 and Mar. 20, 2008, the entire contents of which being incorporated herein by reference.

BACKGROUND OF THE INVENTION

1. Field of the Invention

The present invention relates to an active matrix display device having light-emitting elements arranged in a matrix which are driven by driving means provided for each of the light-emitting elements. The present invention relates more particularly to a technique for providing improved yield of an active matrix display device.

2. Description of the Related Art

An organic EL display device using organic electroluminescence elements (hereinafter referred to as organic EL elements) has been known as a self-luminous active matrix display device. That is, an organic EL display has organic EL elements arranged in a matrix and driving means for each of the organic EL elements. An organic EL element is a current light-emitting element which has an organic substance layer between its anode and cathode electrodes. The organic substance layer includes a hole transporting layer and light-emitting layer stacked one upon another. The light-emitting layer includes an organic substance. Therefore, an organic EL display provides a color gradation by controlling the current level flowing through each of the organic EL elements with the driving means.

FIG. 17 is a plan view illustrating a reference example of wiring structure of an organic EL display 110.

FIG. 18 is a sectional view of the organic EL display 110 shown in FIG. 17 in the row direction (horizontal direction in FIG. 17).

As illustrated in FIG. 17, the organic EL display 110 has organic EL elements 120 arranged in a matrix of m rows by n columns (2 rows by 3 columns in FIG. 17 for simplification).

Here, the organic EL display 110 has TFTs (thin film transistors) 130 (TFT 130a and TFT 130b), capacitor (capacitive element) 140 and other components on a substrate 111 (refer to FIG. 18). On the other hand, each of the TFTs 130 includes, as illustrated in FIG. 18, a gate insulating film 132, a-Si (amorphous silicon) layer 133 and protective film 134 stacked on a gate electrode 131. The TFT 130 also includes a source electrode 135 on the left side of the a-Si layer 133 and a drain electrode 136 on the right side thereof. It should be noted that an n+ a-Si layer 137 is provided to ensure excellent ohmic contact between the a-Si layer 133 and source electrode 135 or drain electrode 136.

On the other hand, a signal line 151 is disposed on the gate insulating film 132. The signal line 151 is one of the drive wirings adapted to drive the organic EL element 120. An insulating film 160 is stacked above the TFT 130 and signal line 151. The insulating film 160 includes an insulating protective film 161 and insulating planarizing film 162. The insulating planarizing film 162 has a flat surface free from irregularities. It should be noted that the drive wirings include not only the signal line 151 but also a scan line 152 and power line 153 as illustrated in FIG. 17. These wirings are disposed in the insulating film 160.

Still further, the organic EL element 120 is disposed on the insulating planarizing film 162 illustrated in FIG. 18. The same element 120 has an organic substance layer 123 between an anode electrode 121 and cathode electrode 122. The anode electrode 121 is connected to the TFT 130 via a connection hole (not shown) formed in the insulating film 160. It should be noted that the organic substance layer 123 includes an organic substance adapted to emit light as a result of the recombination of injected electrons and holes.

Still further, the cathode electrode 122 is a transparent electrode. Therefore, light emitted by the organic substance layer 123 is extracted from the center portion of an opening regulating insulating film 124 surrounding the anode electrode 121. That is, the organic EL display 110 is a top emission display designed to extract light from the side opposite to the substrate 111.

Incidentally, the top emission organic EL display uses a transparent electrode as the cathode electrode 122 as described above so that light emitted by the organic substance layer 123 can be extracted. However, a conductive material having a high transmittance is high in resistance. On the other hand, a metal having a high reflectance, for example, is used for the anode electrode on the side of the substrate 111. Therefore, an auxiliary wiring 154 is disposed around the anode electrode 121 and connected to the cathode electrode 122 to reduce the resistance of the same electrode 122.

The auxiliary wiring 154 is provided on the same layer as the anode electrode 121 as illustrated in FIG. 18. The same wiring 154 overlaps the signal line 151 one above the other. The same line 151 is disposed for each row of the organic EL elements 120 arranged in a matrix. As illustrated in FIG. 17, the auxiliary wiring 154 also overlaps the scan and power lines 152 and 153 one above the other. The scan and power lines 152 and 153 are each disposed for each row of the organic EL elements 120. The auxiliary wiring 154 is insulated from the signal, scan and power lines 151, 152 and 153 by the insulating film (refer to FIG. 18). Further, although the signal line overlaps each of the scan and power lines 152 and 153 one above the other at the intersection, the signal line is insulated from the scan and power lines 152 and 153 by the insulating film 160.

However, the entry of a foreign object, for example, in the manufacturing process may lead to a short circuit, resulting in a lower yield. That is, improper etching in the course of fabricating the TFTs 130 may cause an intralayer short circuit, or dust or other impurity may cause an interlayer short circuit. This leads to a point or line defect in which all the organic EL elements 120 in one entire row or column are faulty, thus resulting in a poor yield. A possible solution to this would be to prevent the auxiliary wiring 154 from overlapping the signal line 151 or other lines by reducing the width of the same wiring 154 or reducing the area over which the same wiring 154 is disposed. This solution, however, leads to a voltage drop across the auxiliary wiring 154, resulting in crosstalk. Further, the signal lines 151 arranged as illustrated in FIG. 17 intersect the scan and power lines 152 and 153.

For this reason, a matrix-wired substrate is known which permits repair of a short circuit. That is, this technique forms a pair of openings in advance in an interlayer insulating film so that the intersection is sandwiched between gate and drain lines. The drain line crosses over the gate line. The interlayer insulating film covers the drain line. The drain line is exposed in the openings. If a short circuit is detected at the intersection between the two lines due to a defect of the interlayer insulating film in the inspection process, the interlayer insulating film is destroyed on the inside (short-circuited side) of each of the pair of openings sandwiching the short-circuited area, after which the drain line beneath the interlayer insulating film is cut off. Then, a bypass line is formed so as to bypass the short-circuited area via the pair of openings, thus rejoin the cut segments of the drain line (refer, for example, to Japanese Patent Laid-Open No. 2000-241833, hereinafter referred to as Patent Document 1).

SUMMARY OF THE INVENTION

However, the technique disclosed in the above patent document 1 simply forms, in advance, a pair of openings on both sides of the intersection where a short circuit is likely to develop. A bypass line is formed following a short circuit. This requires a new bypass line formation step. The repair of a short circuit is labor- and time-consuming.

In light of the foregoing, it is desirable to permit repair of a short-circuited area in an easy and quick manner in the event of an intralayer or interlayer short circuit in wirings such as auxiliary wiring, and signal, scan and power lines without forming a new bypass line.

The present invention solves the above problem by the following means.

The embodiment of the present invention is an active matrix display device which includes driving means provided on a substrate and insulating film stacked on the substrate. The display device further includes light-emitting elements arranged in a matrix on the insulating film. Each of the light-emitting elements has a light-emitting layer between its upper and lower electrodes. The display device is driven by the driving means provided for each of the light-emitting elements. The display device is characterized in that it includes first and second wirings. The first wiring is required to cause the light-emitting element to emit light. The second wiring is disposed in the underlying layer of the first wiring via the insulating film. The second wiring is also required to cause the light-emitting element to emit light. The first or second wiring is branched into a plurality of wirings at the intersection between the first and second wiring wirings.
(Advantageous Effect)

The embodiment includes first and second wirings. The first wiring is required to cause a light-emitting element to emit light. The second wiring is disposed in the underlying layer of the first wiring via an insulating film. The second wiring is also required to cause the light-emitting element to emit light. The first or second wiring is branched into a plurality of wirings at the intersection between the first and second wirings. The branching allows a bypass line to be available in advance.

According to the above embodiment, the first or second wiring is branched into a plurality of wirings at the intersection between the first and second wirings. As a result, a bypass line is available in advance. In the event of a short circuit caused, for example, by the entry of a foreign object in the manufacturing process, therefore, the short-circuited area can be bypassed using the bypass line, thus allowing to repair the short-circuited area in an easy and quick manner. This provides improved yield of an active matrix display device.

BRIEF DESCRIPTION OF THE DRAWINGS

FIG. 18 is a sectional view of the organic EL display illustrated in FIG. 17 in the row direction (horizontal direction in FIG. 17).

DETAILED DESCRIPTION OF THE PREFERRED EMBODIMENTS

The preferred embodiments of the present invention will be described below with reference to the accompanying drawings and other supporting materials.

Figure 1:
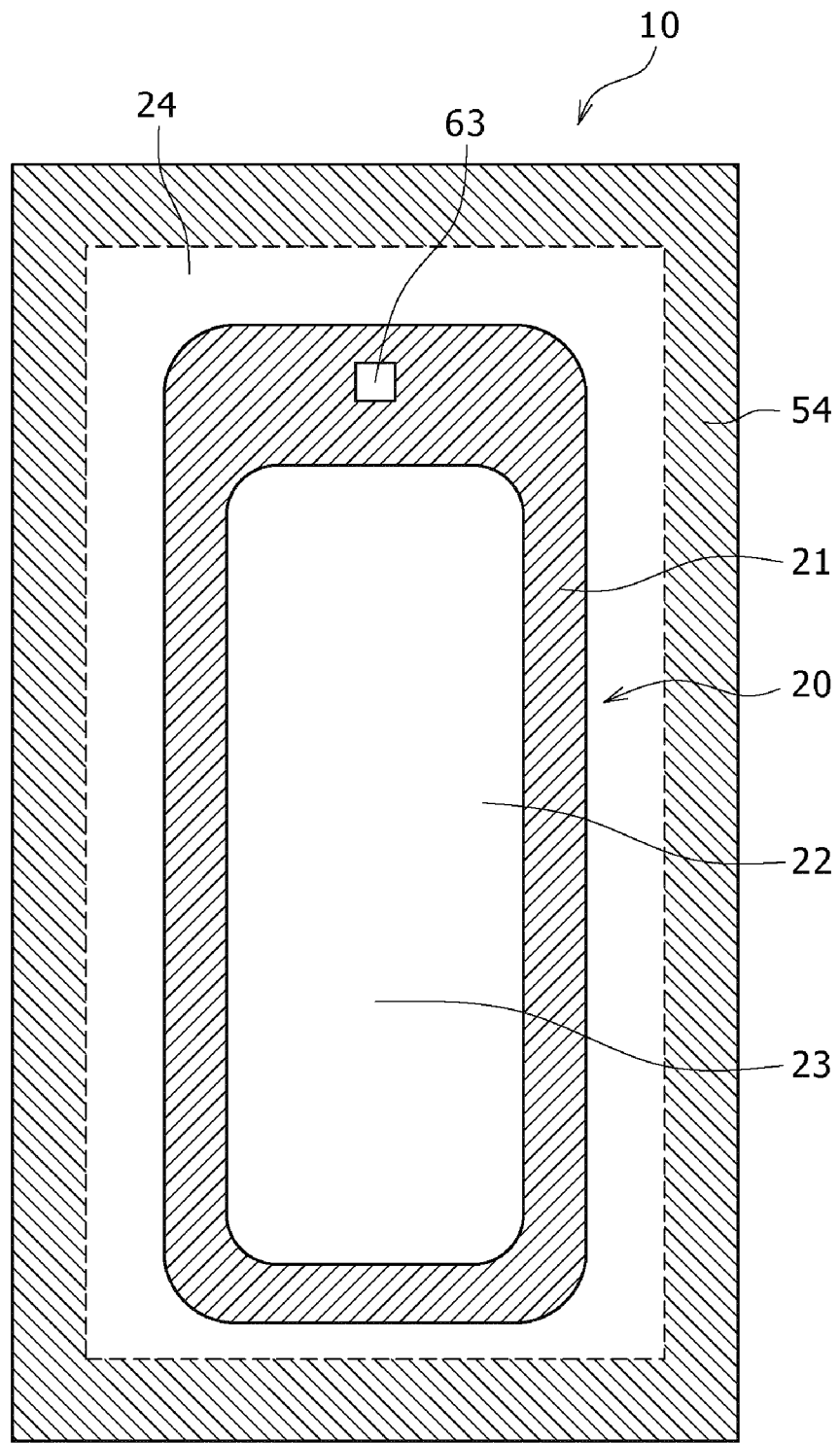
FIG. 1 is a plan view illustrating an organic EL display according to a first embodiment as an example of an active matrix display device of the present invention.

FIG. 1 is a plan view illustrating an organic EL display 10 according to a first embodiment of the present invention as an example of an active matrix display device.

Figure 2:
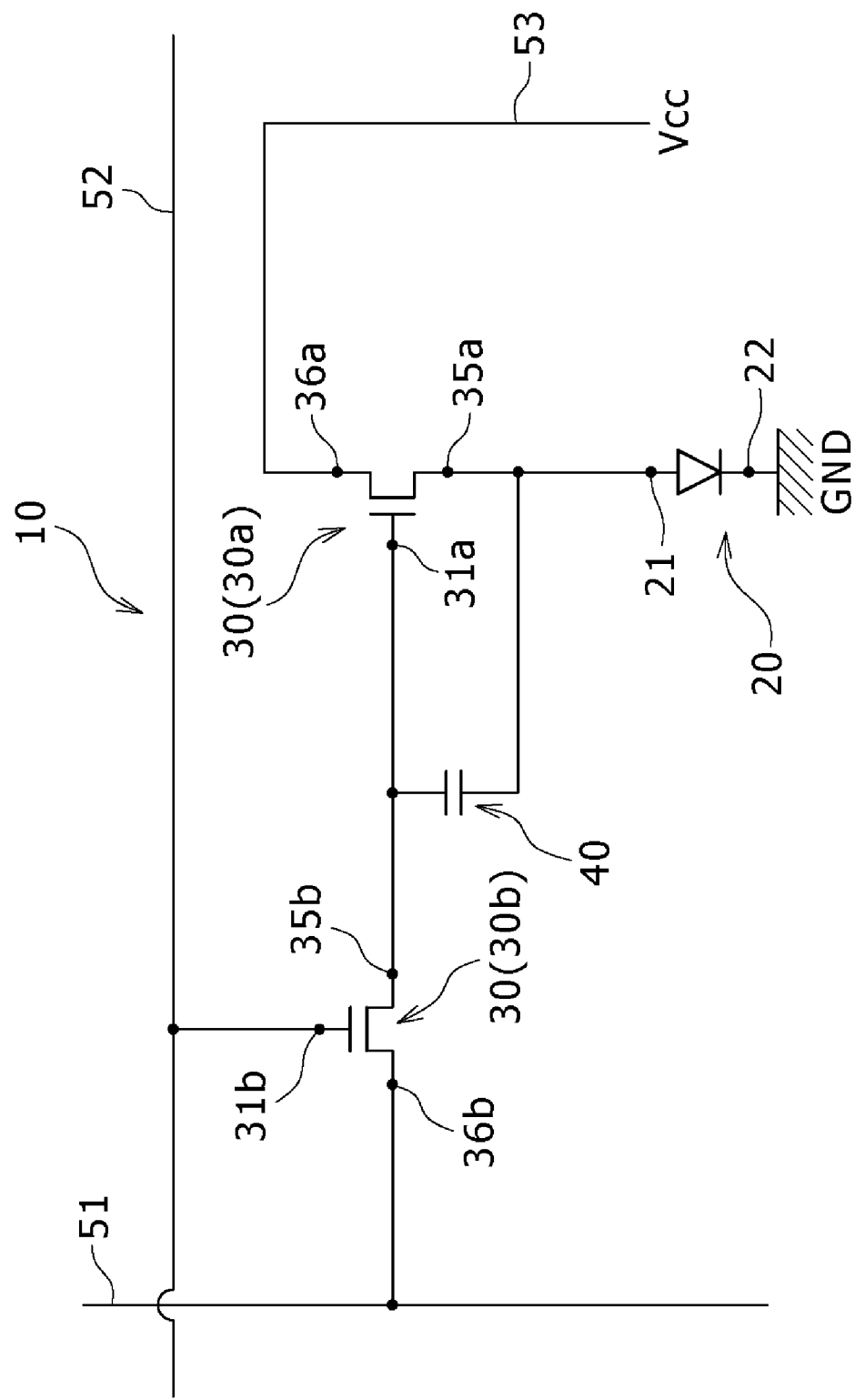
FIG. 2 is an equivalent circuit diagram of the organic EL display illustrated in FIG. 1.

FIG. 2 is an equivalent circuit diagram of the organic EL display 10 illustrated in FIG. 1.

As illustrated in FIG. 1, the organic EL display 10 includes organic EL elements 20. Each of the same elements 20 includes an anode electrode 21 (corresponds to the lower electrode in the present embodiment), cathode electrode 22 (corresponds to the upper electrode in the present embodiment) and organic substance layer 23 (corresponds to the light-emitting layer in the present embodiment). It should be noted that the cathode electrode 22 is a transparent electrode.

The organic EL element 20 is driven by TFTs 30 (TFT 30a and TFT 30b) and capacitor 40, illustrated in FIG. 2, which serve as a driving section of the present embodiment. That is, the organic EL display 10 includes, for example, the organic EL element 20, TFT 30a, TFT 30b and capacitor 40. The organic EL element 20 has the cathode electrode 22 connected to GND (ground). The TFT 30a has a source electrode 35a connected to the anode electrode 21 of the organic EL element 20 and a drain electrode 36a connected to a power line 53 at positive potential (Vcc). The TFT 30b has a source electrode 35b connected to the gate electrode 31a of the TFT 30a, a gate electrode 31b connected to a scan line 52, and a drain electrode 36b connected to a signal line 51. The capacitor 40 is connected between the source electrode 35a of the TFT 30a and the source electrode 35b of the TFT 30b.

In the organic EL display 10 configured as described above, the TFT 30a is a drive transistor and the TFT 30b a switching transistor. When a write signal is applied to the scan line 52 to control the potential of the gate electrode 31b of the TFT 30b, a signal voltage of the signal line 51 is applied to the gate electrode 31a of the TFT 30a. At this time, the potential of the gate electrode 31a is stably maintained by the capacitor 40 until the next time a write signal is applied to the scan line 52. During this time period, a current appropriate to the voltage between the gate electrode 31a and source electrode 35a of the TFT 30a flows through the organic EL element 20. This causes the same element 20 to continuously emit light at the brightness appropriate to the current level.

Thus, the organic EL display 10 controls the current level flowing through the organic EL element 20, thus causing the same element 20 to emit light. Further, the organic EL display 10 drives the power line 53 by pulses to drive each of the organic EL elements 20. Therefore, the different rows of the organic EL element 20 arranged in a matrix are fed with different pulses rather than a common pulse via the power line 53. So long as the circuit operates properly, the correction terms for variations of a threshold voltage and mobility, i.e., the characteristics of the TFT 30a (drive transistor), are included in the voltage of the organic EL element 20 at the time of light emission. Therefore, no terms are included which may be affected by the current-voltage characteristic of the organic EL element 20. This makes it possible to suppress the deterioration of the same element 20 over time and the characteristic variations of the TFT 30a.

Here, light generated by the organic EL element 20 is extracted from the exposed portion (center portion) of an opening regulating insulating film 24 illustrated in FIG. 1. That is, the opening regulating insulating film 24 is provided around the anode electrode 21 and organic substance layer 23 and has an opening at the center portion. Therefore, light generated by the organic EL element 20 is emitted externally from the center portion of the opening regulating insulating film 24 through the transparent cathode electrode 22. It should be noted that an auxiliary wiring 54 (corresponds to the first wiring in the present embodiment) is disposed in the opening regulating insulating film 24. The same wiring 54 is adapted to adjust the electrical resistance of the cathode electrode 22.

Figure 3:
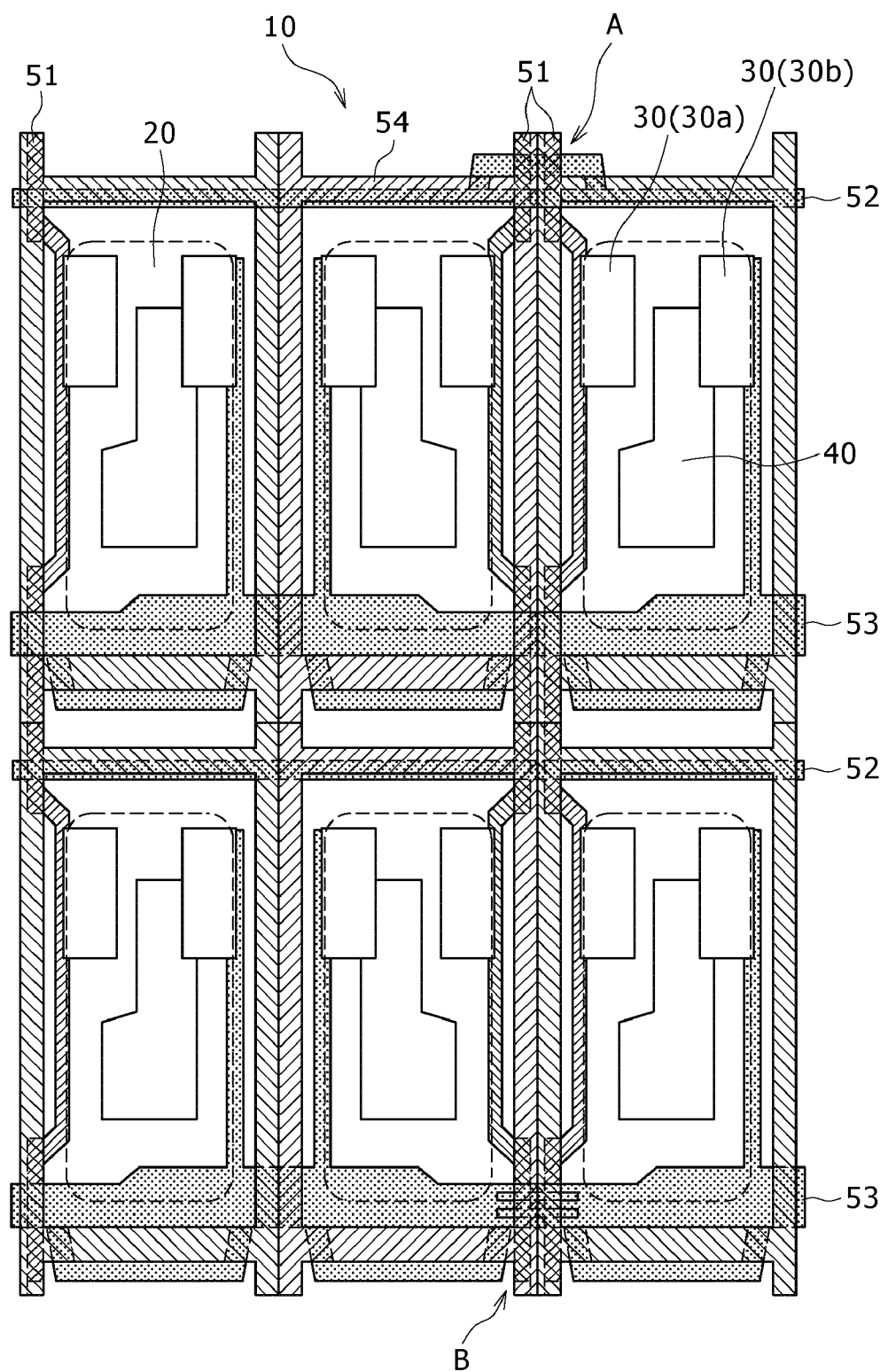
FIG. 3 is a plan view illustrating the wiring structure of the organic EL display according to the first embodiment as an example of the active matrix display device of the present invention.

FIG. 3 is a plan view illustrating the wiring structure of the organic EL display 10 according to the first embodiment of the present invention as an example of the active matrix display device.

Figure 4:
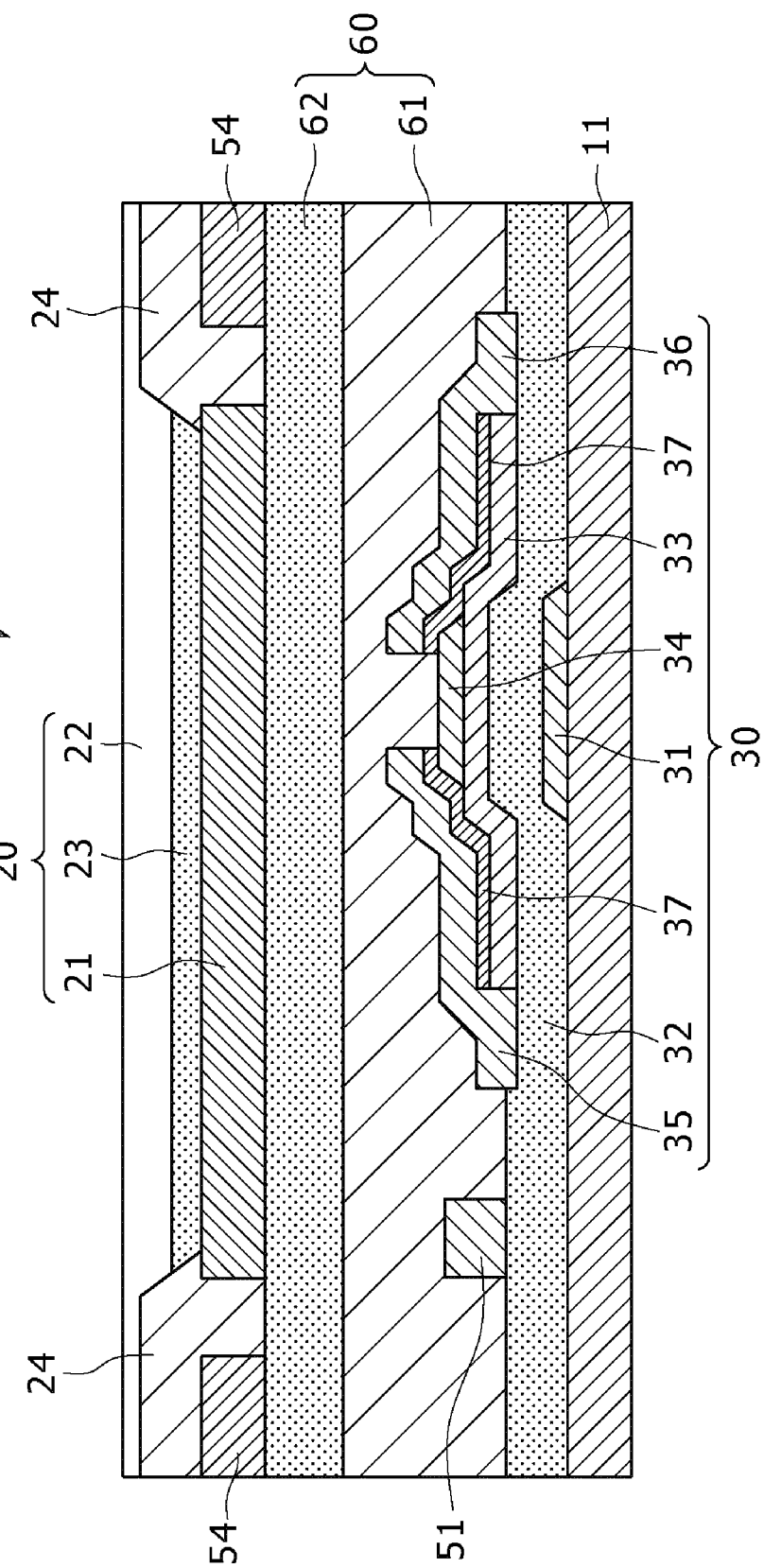
FIG. 4 is a sectional view of the organic EL display illustrated in FIG. 3 in the row direction (horizontal direction in FIG. 3)

FIG. 4 is a sectional view of the organic EL display 10 illustrated in FIG. 3 in the row direction (horizontal direction in FIG. 3).

As illustrated in FIG. 3, the organic EL display 10 has the organic EL elements 20 arranged in a matrix of M rows by N columns (2 rows by 3 columns in FIG. 3 for simplification).

Here, the organic EL display 10 is an active matrix display device having, on a substrate 11 (refer to FIG. 4), TFTs (thin film transistors) 30 (TFT 30a and TFT 30b) adapted to drive the organic EL element 20 for each of the same elements 20. It should be noted that the capacitor 40 and other components are also provided on the substrate 11 in addition to the TFTs 30 (TFT 30a and TFT 30b).

The TFT 30 includes, as illustrated in FIG. 4, a gate insulating film 32 (corresponds to the insulating film in the present embodiment), a-Si layer 33 and protective film 34 stacked on a gate electrode 31. The TFT 30 also includes a source electrode 35 on the left side of the a-Si layer 33 and a drain electrode 36 on the right side thereof. It should be noted that an n+ a-Si layer 37 containing an n-type impurity is provided to ensure excellent ohmic contact between the a-Si layer 33 and source electrode 35 or drain electrode 36.

In order to manufacture the TFT 30 as described above, the gate electrode 31 is formed first on the substrate 11 made, for example, of glass using a conductive material such as Mo (molybdenum). Next, the gate insulating film 32 is formed so as to cover the substrate 11 and gate electrode 31. Then, the a-Si layer 33 is formed on the gate insulating film 32 above the gate electrode 31. Then, the protective film 34 is formed at the center portion of the a-Si layer 33 (above the gate electrode 31). At the same time, the n+ a-Si layer 37 is formed on both sides of the center portion of the a-Si layer 33. Then, a metallic layer is formed, for example, with Al (aluminum) on the gate insulating film 32 and n+ a-Si layer 37, after which the metallic layer is patterned for use as the source electrode 35 and drain electrode 36.

Further, on the gate insulating film 32 is disposed the signal line 51 (corresponds to the first wiring in the present embodiment) which is one of the drive wirings adapted to drive the organic EL element 20. In addition to the signal line 51, the scan line 52 (corresponds to the first wiring in the present embodiment) and power line 53 (corresponds to the first wiring in the present embodiment) as illustrated in FIG. 3 also serve as the drive wirings. These drive wirings are patterned in an insulating film 60 and insulated from each other. That is, an insulating protective film 61 is disposed around the TFT 30, signal line 51 and other components. Then, an insulating planarizing film 62 is stacked on the insulating protective film 61 to form together the insulating film 60. It should be noted that the insulating planarizing film 62 is adapted to provide a flat surface free from irregularities on the insulating film 60.

Further, on the insulating planarizing film 62 is disposed the organic EL element 20. The same element 20 has the organic substance layer 23 between the anode electrode 21 and cathode electrode 22. The anode electrode 21 is connected to the TFT 30 via a connection hole 63 (refer to FIG. 1) formed in the insulating film 60. The organic substance layer 23 includes an organic substance adapted to emit light as a result of the recombination of injected electrons and holes.

Light emitted by the organic substance layer 23 is extracted from the center portion of the opening regulating insulating film 24 surrounding the anode electrode 21. That is, a metal having a high reflectance, for example, is used for the anode electrode 21. In contrast, the cathode electrode 22 is a transparent electrode made of a conductive material having a high transmittance. Therefore, light emitted by the organic substance layer 23 is extracted from the side opposite to the substrate 11. The top emission organic EL display 10 configured as described above is effective for delivering a high numerical aperture of the organic EL element 20.

Here, the conductive material having a high transmittance which makes up the cathode electrode 22 is high in resistance. In order to adjust the electrical resistance of the cathode electrode 22 to a reduced resistance, therefore, the auxiliary wiring 54 is connected to the cathode electrode 22. The same wiring 54 is disposed around the anode electrode 21. The same wiring 54 is at the same potential as the cathode electrode 22 and grounded, for example, to GND (refer to FIG. 2).

Further, the organic EL display 10 has the signal line 51 disposed for each column of the organic EL elements 20 arranged in a matrix, as illustrated in FIG. 3. The organic EL display 10 also has the scan line 52 disposed for each row (on top of each row) of the organic EL elements 20 and the power line 53 disposed for each row (at the bottom of each row) thereof. The signal, scan and power lines 51, 52 and 53 are disposed in the underlying layer of the auxiliary wiring 54 which is provided in the same layer as the anode electrode 21 (refer to FIG. 4). Therefore, the signal, scan and power lines 51, 52 and 53 and auxiliary wiring 54 overlap each other one above the other at some points. Further, the signal line 51 intersects the scan and power lines 52 and 53 at some points.

For the signal, scan and power lines 51, 52 and 53 and auxiliary wiring 54 disposed as described above, the two signal lines 51 and scan line 52 overlap each other at an intersection A. That is, the two signal lines 51, adjacent to each other and one disposed for each column of the organic EL elements 20, intersect the scan line 52, disposed for each row of the same elements 20, at right angle. The two signal lines 51 run under the scan line 52. (Each of the signal lines 51 is split where it intersects the scan line 52. The split segments of each of the signal lines 51 are joined together by a signal connection line 51a (not shown) which will be described later. The signal connection lines 51a are disposed in the underlying layer of the scan line 52.) This makes a short circuit likely to develop at the intersection A (between the signal connection line 51a and scan line 52) due to the potential difference between the two (signal and scan lines 51 and 52).

On the other hand, the two signal lines 51 and power line 53 overlap each other at an intersection B. That is, the two signal lines 51, adjacent to each other and one disposed for each column of the organic EL elements 20, intersect the power line 53, disposed for each row of the same elements 20, at right angle. The two signal lines 51 run under the power line 53. (Each of the signal lines 51 is split where it intersects the power line 53. The split segments of each of the signal lines 51 are joined together by a signal connection line 51b (not shown) which will be described later. The signal connection lines 51b are disposed in the underlying layer of the power line 53). This makes a short circuit likely to develop also at the intersection B (between the signal connection line 51b and power line 53.) due to the potential difference between the two (signal and power lines 51 and 53).

Particularly, upsizing of the organic EL display 10 leads to more frequent short-circuits, resulting in lower yield. As a result, a laser repair step is essential to repair the short-circuited area. That is, the manufacturing process of the organic EL display 10 includes an inspection step adapted to optically inspect for short-circuits and a repair step adapted to repair the detected short-circuited area by laser irradiation.

In the organic EL display 10 according to the first embodiment, therefore, the scan line 52 is branched into two lines where the signal and scan lines 51 and 52 overlap each other (intersection A) as illustrated in FIG. 3. Further, the power line 53 is branched into three lines where the signal and power lines 51 and 53 overlap each other (intersection B). It should be noted that the signal lines 51 are disposed inwardly for bypassing purposes to ensure that the same lines 51 hardly overlap the auxiliary wiring 54 one above the other.

Figure 5A:
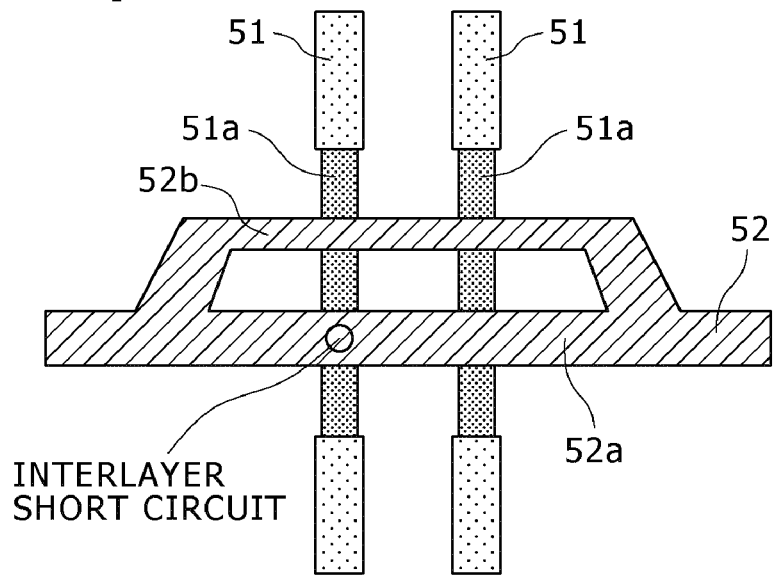
FIGS. 5A and 5B are plan views illustrating the intersection between signal and scan lines in the organic EL display according to the first embodiment as an example of the active matrix display device of the present invention.
Figure 5B:
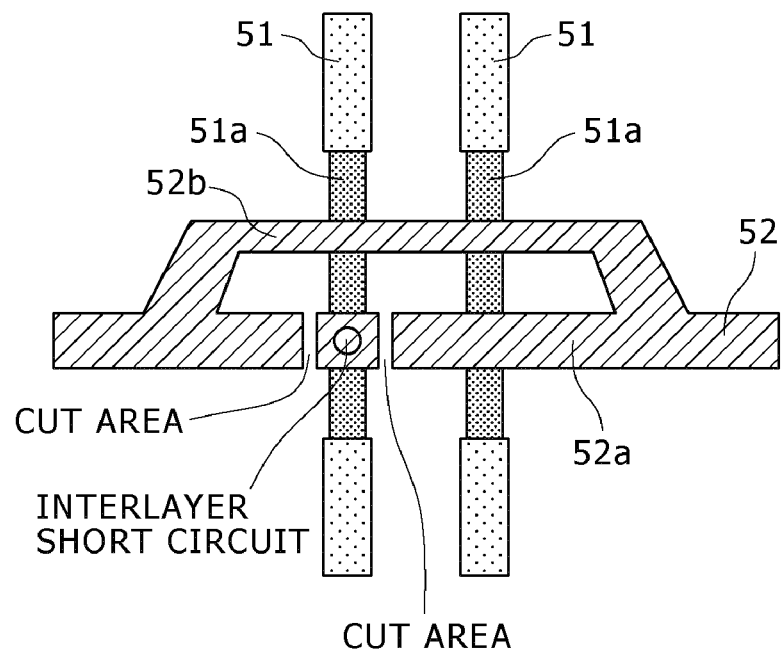

FIGS. 5A and 5B are plan views illustrating the intersection A (intersection A illustrated in FIG. 3) between the signal and scan lines 51 and 52 in the organic EL display 10 according to the first embodiment of the present invention as an example of the active matrix display device.

As illustrated in FIGS. 5A and 5B, each of the two signal lines 51 is split at the intersection A where it intersects the scan line 52. The split segments of each of the signal lines 51 are joined together by the signal connection line 51a (corresponds to the second wiring in the present embodiment). Each of the signal connection lines 51a intersects the scan line 52 at right angle one above the other. The two signal lines 51 run under the scan line 52. Further, the scan line 52 is branched into two lines. Therefore, the scan line 52 has two branch lines where it overlaps each of the signal connection lines 51a. One of the two branch lines is a main wiring 52a. The other branch line is a redundant wiring 52b which branches off from the main wiring 52a. As a result, a bypass line is available in advance.

Here, if a short circuit develops between the signal connection line 51a of the signal line 51 on the left and the main wiring 52a of the scan line 52 as illustrated in FIG. 5A (intralayer short circuit between the scan line 52 on top which corresponds to the first wiring and the signal connection line 51a provided below the scan line 52 via the gate insulating film 32 (refer to FIG. 4)), it is only necessary to cut the main wiring 52a on both sides of the short-circuited area as illustrated in FIG. 5B. As a result, the main wiring 52a is no longer functional. However, the redundant wiring 52b bypassing the short-circuited area serves as a bypass line. This means that the short circuit has been repaired. It should be noted that if a short circuit develops between the signal connection line 51a of the signal line 51 and the redundant wiring 52b of the scan line 52, the main wiring 52a serves as a bypass line.

Figure 6A:
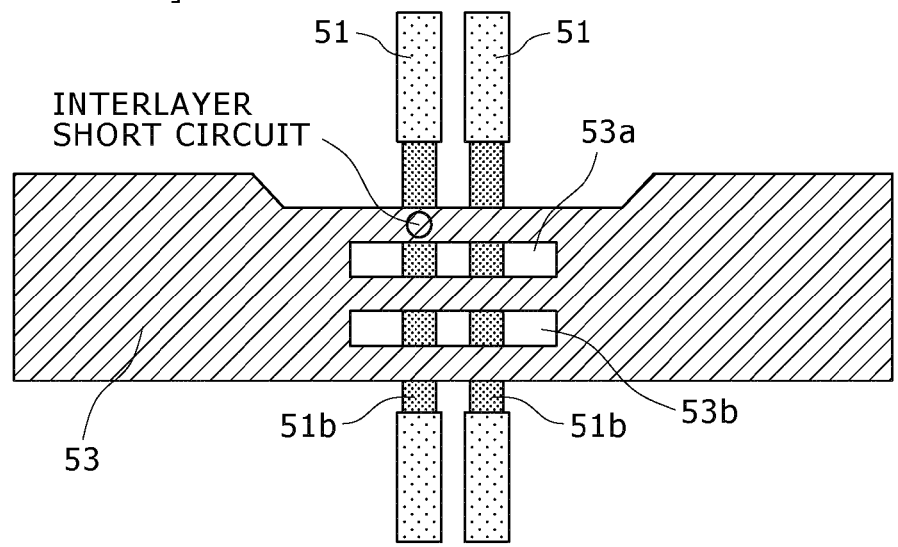
FIGS. 6A and 6B are plan views illustrating the intersection between signal and power lines in the organic EL display according to the first embodiment as an example of the active matrix display device of the present invention.
Figure 6B:
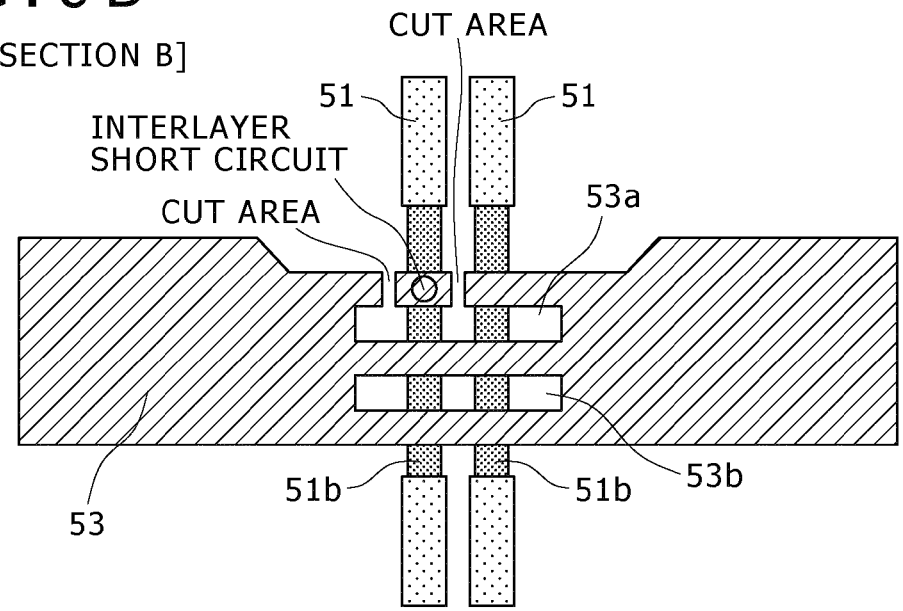

FIGS. 6A and 6B are plan views illustrating the intersection B (intersection B illustrated in FIG. 3) between the signal and power lines 51 and 53 in the organic EL display 10 according to the first embodiment of the present invention as an example of the active matrix display device.

As illustrated in FIGS. 6A and 6B, each of the two signal lines 51 is split at the intersection B where it intersects the power line 53. The split segments of each of the signal lines 51 are joined together by the signal connection line 51b (corresponds to the second wiring in the present embodiment). Each of the signal connection lines 51b intersects the power line 53 at right angle one above the other. The two signal lines 51 run under the power line 53. Further, the power line 53 is branched into three lines by slits 53a and 53b. Therefore, the power line 53 has three branch lines where it overlaps each of the signal connection lines 51*b*. As a result, bypass lines are available in advance.

Here, if a short circuit develops between the signal connection line 51*b* of the signal line 51 on the left and the portion above the slit 53*a* of the power line 53 as illustrated in FIG. 6A (intralayer short circuit between the power line 53 on top which corresponds to the first wiring and the signal connection line 51*b* provided below the power line 53 via the gate insulating film 32 (refer to FIG. 4)), it is only necessary to cut the power line 53 on both sides of the short-circuited area as illustrated in FIG. 6B. As a result, the portion of the power line 53 above the slit 53*a* is no longer functional. However, the portion between the slits 53*a* and 53*b* and that below the slit 53*b* bypassing the short-circuited area serve as bypass lines. This means that the short circuit has been repaired.

Thus, in the organic EL display 10 according to the first embodiment, the scan line 52 is branched into two lines where the signal connection lines 51*a* of the signal lines 51 and the scan line 52 overlap each other (intersection A). Also, the power line 53 is branched into three lines where the signal connection lines 51*b* of the signal lines 51 and the power line 53 overlap each other (intersection B). As a result, bypass lines are available in advance. In the event of a short circuit (intralayer short circuit) caused, for example, by the entry of a foreign object in the manufacturing process, therefore, the short-circuited area can be bypassed using the bypass line, thus allowing to repair the short-circuited area in an easy and quick manner. This provides improved yield.

Figure 7:
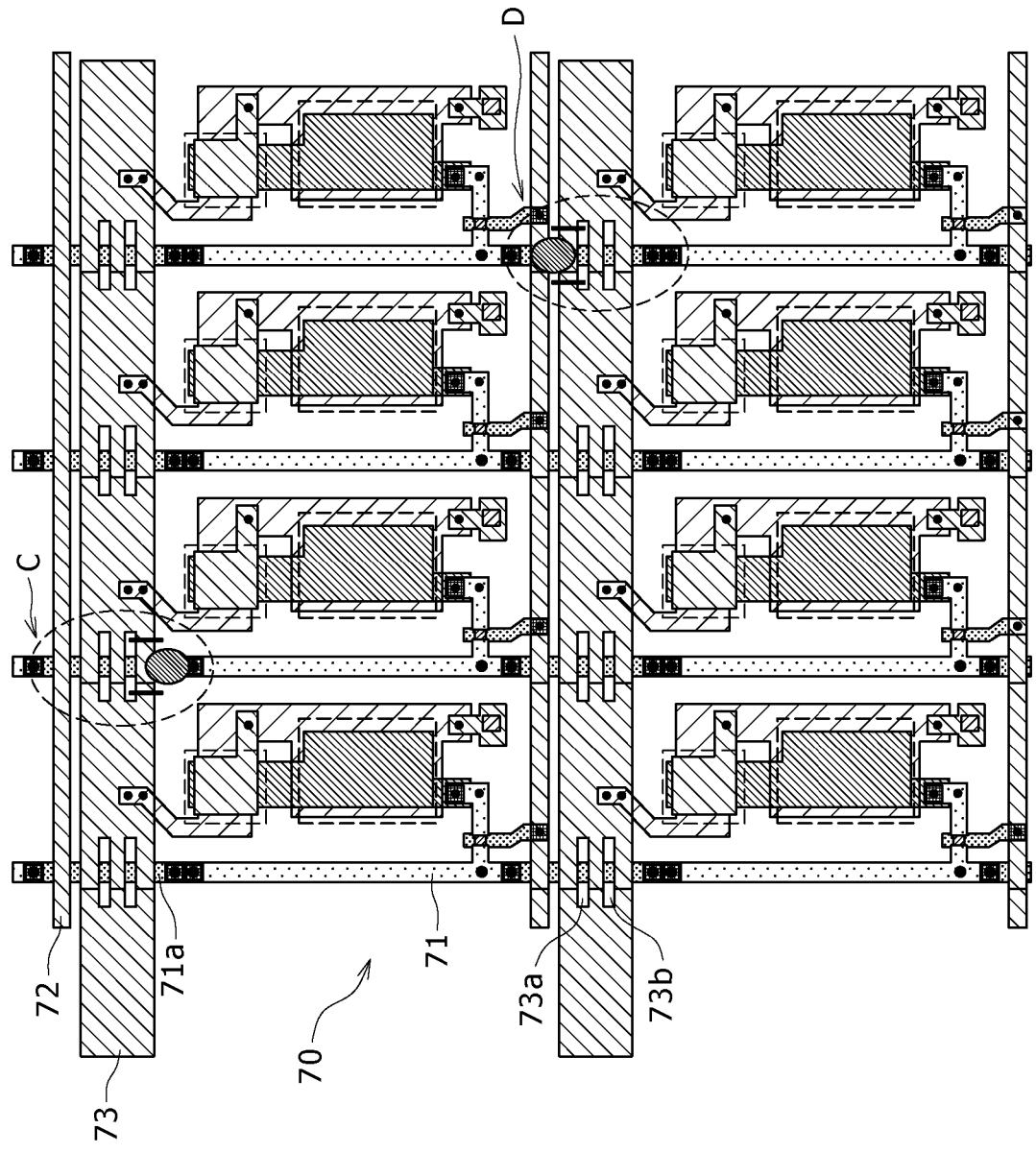
FIG. 7 is a plan view illustrating the wiring structure of an organic EL display according to a second embodiment as an example of the active matrix display device of the present invention.

FIG. 7 is a plan view illustrating the wiring structure of an organic EL display 70 according to a second embodiment of the present invention as an example of the active matrix display device.

As illustrated in FIG. 7, the organic EL display 70 has organic EL elements (not shown) arranged in a matrix of M rows by N columns (2 rows by 4 columns in FIG. 7 for simplification).

Here, the organic EL display 70 has a signal line 71 (corresponds to the first wiring in the present embodiment) disposed for each column of the organic EL elements arranged in a matrix. The organic EL display 70 also has a scan line 72 (corresponds to the first wiring in the present embodiment) disposed for each row (at the bottom of each row) of the organic EL elements and a power line 73 (corresponds to the first wiring in the present embodiment) disposed for each row (on top of each row) thereof. Therefore, the signal line 71 intersects the scan and power lines 72 and 73 at some points. Further, the scan and power lines 72 and 73 are disposed in proximity to each other.

The signal, scan and power lines 71, 72 and 73 disposed as described above overlap each other, for example, at an intersection C. That is, the signal line 71, disposed for each column of the organic EL elements, intersects the scan and power lines 72 and 73, disposed for each row of the same elements, at right angle. The signal line 71 runs under the scan and power lines 72 and 73. (The signal line 71 is split where it intersects the scan and power lines 72 and 73. The split segments of the signal line 71 are joined together by a signal connection line 71*a* (corresponds to the second wiring in the present embodiment)). The signal connection line 71*a* is disposed in the underlying layer of the scan and power lines 72 and 73. As a result, a short circuit may develop at the intersection C between the signal and power lines 71 and 73 (intralayer short circuit between the end portion of the split segment of the signal line 71 and the side portion of the power line 73) as illustrated in FIG. 7.

On the other hand, the scan and power lines 72 and 73 are in proximity to each other at an intersection D. That is, the scan line 72 disposed for each row (at the bottom of each row) of the organic EL elements and the power line 73 disposed for each row (on top of each row) thereof run parallel to each other with a small spacing therebetween. The signal connection line 71*a* of the signal line 71 is disposed in the underlying layer of the scan and power lines 72 and 73. As a result, a short circuit may develop at the intersection D between the scan and power lines 72 and 73 (intralayer short circuit between the side portion of the scan line 72 and the side portion of the power line 73) as illustrated in FIG. 7.

Therefore, in the organic EL display 70 according to the second embodiment, the power line 73 is branched into three lines by rectangular slits 73*a* and 73*b* where the signal connection line 71*a* of the signal line 71 and the scan and power lines 72 and 73 overlap each other (intersections C and D) as illustrated in FIG. 7. If a short circuit is detected in the manufacturing process (inspection step) of the organic EL display 70 due, for example, to improper etching, the detected short-circuited area is cut off by laser irradiation from the surface, after which the short circuit is repaired to prevent line and other defects (bold portions at the intersections C and D).

Figure 8A:
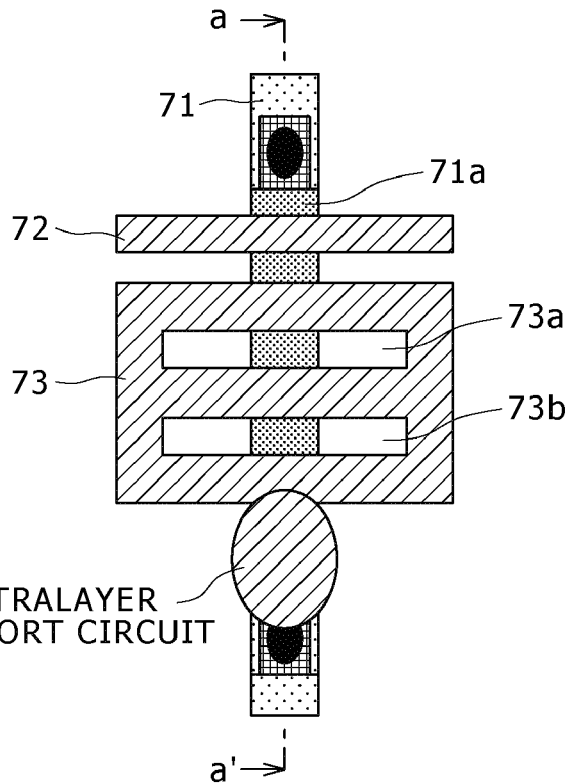
FIGS. 8A and 8B are plan views illustrating the condition before the repair of a short circuit at the intersection between the signal and power lines in the organic EL display according to the second embodiment as an example of the active matrix display device of the present invention.
Figure 8B:
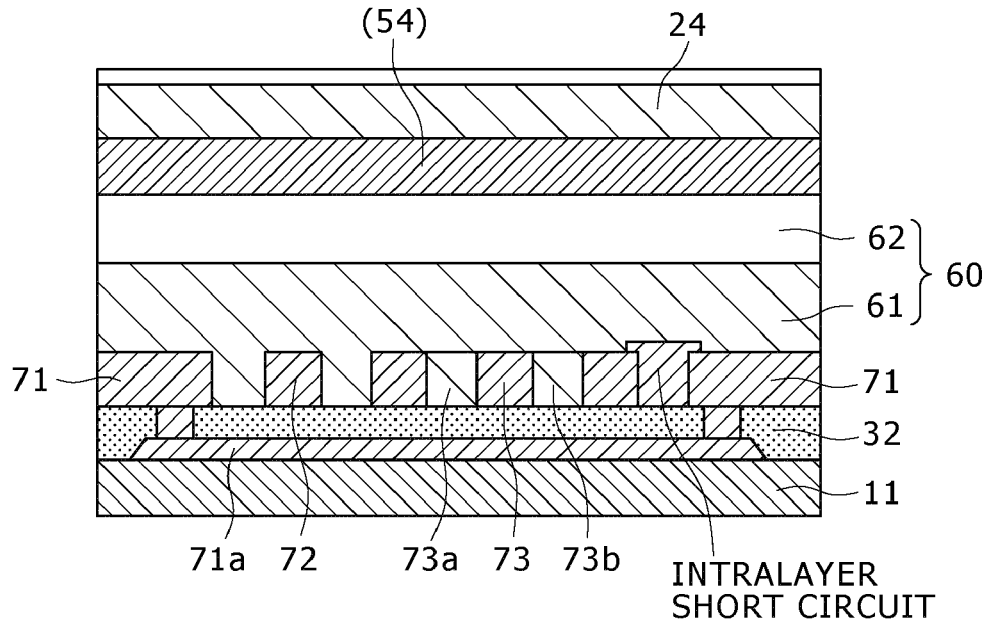

FIGS. 8A and 8B are plan views illustrating the condition before the repair of a short circuit at the intersection C (intersection C illustrated in FIG. 7) between the signal and power lines 71 and 73 in the organic EL display 70 according to the second embodiment of the present invention as an example of the active matrix display device.

Figure 9A:
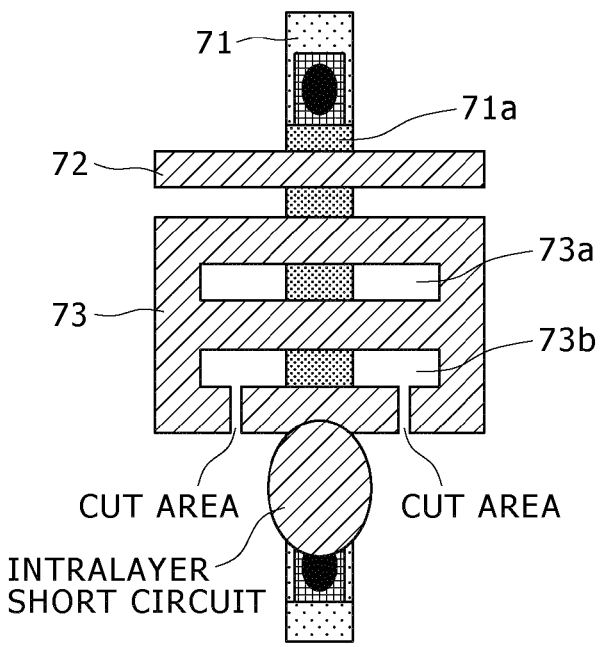
FIGS. 9A and 9B are plan views illustrating the condition after the repair of a short circuit at the intersections between the signal, scan and power lines in the organic EL display according to the second embodiment as an example of the active matrix display device of the present invention.
Figure 9B:
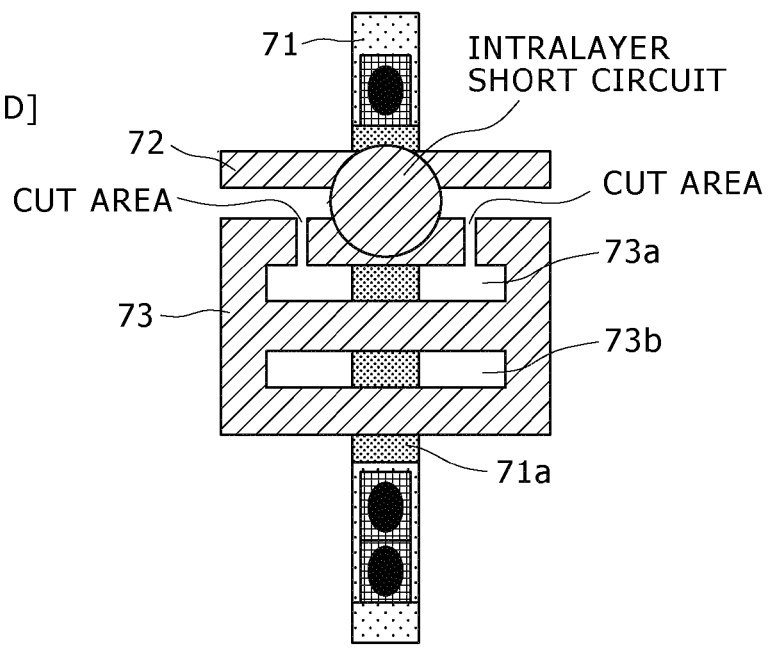

FIGS. 9A and 9B are plan views illustrating the condition after the repair of a short circuit at the intersections C and D (intersections C and D illustrated in FIG. 7) between the signal, scan and power lines 71, 72 and 73 in the organic EL display 70 according to the second embodiment of the present invention as an example of the active matrix display device.

As illustrated in FIGS. 8 and 9, the signal line 71 is split where it intersects the scan and power lines 72 and 73. The split segments of the signal line 71 are joined together by the signal connection line 71*a*. The signal connection line 71*a* intersects the scan and power lines 72 and 73 at right angle one above the other. The signal connection line 71*a* runs under the scan and power lines 72 and 73. Further, the power line 73 is branched into three lines by the rectangular slits 73*a* and 73*b*. Therefore, the power line 73 has three branch lines where it overlaps the signal connection line 71*a*. As a result, bypass lines are available in advance.

Here, a short circuit may develop on the signal connection line 71*a* between the signal line 71 corresponding to the first wiring and the portion below the slit 73*b* of the power line 73 corresponding to the second wiring (intralayer short circuit between the end portion of the split signal line 71 and the side portion of the power line 73) as illustrated at the intersection C of FIG. 8A. That is, the signal and power lines 71 and 73 formed in the same layer on the gate insulating film 32 are disposed with a given spacing (gap) therebetween, as illustrated in FIG. 8B. However, an intralayer short circuit develops in the event of entry of a foreign object in the gap. It should be noted that such an intralayer short circuit may also develop between the signal and scan lines 71 and 72 and between the scan and power lines 72 and 73, as is obvious from FIG. 8B. On the other hand, the entry of a foreign object in the gate insulating film 32, for example, may result in an interlayer short circuit via the gate insulating film 32 between the scan or power line 72 or 73 on top (corresponds to the first wiring in this case) and the signal connection line 71*a* at the bottom (corresponds to the second wiring in this case). Further, if a foreign object enters the insulating film 60 when the auxiliary wiring 54 is provided, an interlayer short circuit via the gate insulating film 60 may develop between the auxiliary wiring 54 on top and the signal, scan or power line 71, 72 or 73 at the bottom (corresponds to the second wiring in this case).

As described above, an intralayer or interlayer short circuit may develop in the organic EL display 70. However, if an intralayer short circuit develops between the signal and power lines 71 and 73 as illustrated at the intersection C of FIG. 8A, it is only necessary to cut the power line 73 on both sides of the short-circuited area as illustrated in FIG. 9B. As a result, the portion of the power line 73 below the slit 73b is no longer functional. However, the portion between the slits 73a and 73b and that above the slit 73a bypassing the short-circuited area serve as bypass lines. This means that the short circuit has been repaired.

On the other hand, if an intralayer short circuit develops between the scan and power lines 72 and 73 on the signal connection line 71a as illustrated at the intersection D of FIG. 9B, it is only necessary to cut the power line 73 on both sides of the short-circuited area. As a result, the portion above the slit 73a is no longer functional. However, the portion between the slits 73a and 73b and that below the slit 73b bypassing the short-circuited area serve as bypass lines. This means that the short circuit has been repaired.

Incidentally, a current light-emitting element such as organic EL element requires a current to flow therethrough. Therefore, a current necessary for light emission flows through the power line 73. As a result, the voltage drops off gradually with increasing distance from the power source. In such a case, shading occurs in which the brightness drops off gradually with decreasing voltage. In addition to the shading, crosstalk also occurs.

Figure 10:
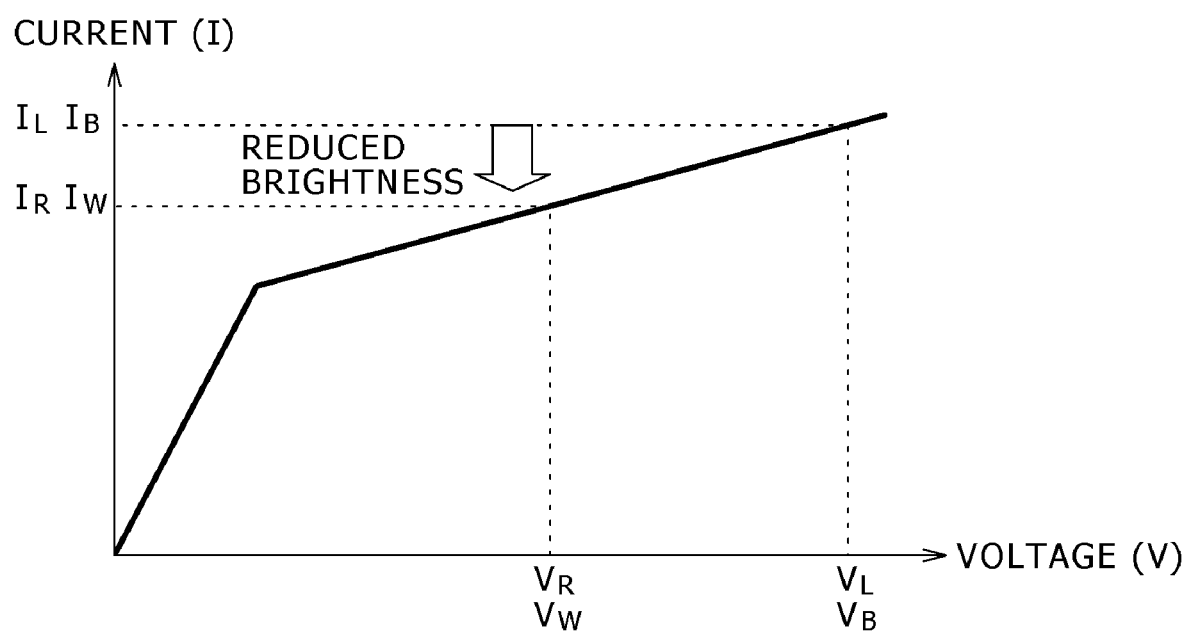
FIG. 10 is a graph illustrating the reduction in brightness of the organic EL display illustrated in FIGS. 9A and 9B.

FIG. 10 is a graph illustrating the reduction in brightness of the organic EL display 70 illustrated in FIGS. 9A and 9B.

As illustrated in FIG. 10, a voltage VR at the right end of the organic EL display 70 far from the power source of the same display 70 is lower than a voltage VL at the left end thereof. As a result, shading occurs which causes the brightness to decline gradually from the left to right end of the organic EL display 70.

Further, when a black display window image is displayed, the voltage drops to a different extent (voltage VB for partly black and VW for wholly white) between a line in which black is displayed partly and another in which white is displayed entirely, despite the intention to display white at the same brightness at the right end. This leads to crosstalk, causing the brightness to decline in the entirely white line where the voltage drop is significant.

Therefore, the power line 73 (refer to FIG. 7) of a current light-emitting element such as organic EL element must be reduced in resistance to prevent shading and crosstalk (voltage drop).On the other hand, forming the slits 73a and 73b as illustrated in FIG. 7 results in a higher resistance of the power line 73. As a result, the prevention of shading and crosstalk runs counter to the formation of the slits 73a and 73b.

Therefore, a description will be given next of an organic EL display 80 according to a third embodiment which can prevent shading and crosstalk while at the same time permitting repair of a short circuit in an easy and quick manner.

Figure 11:
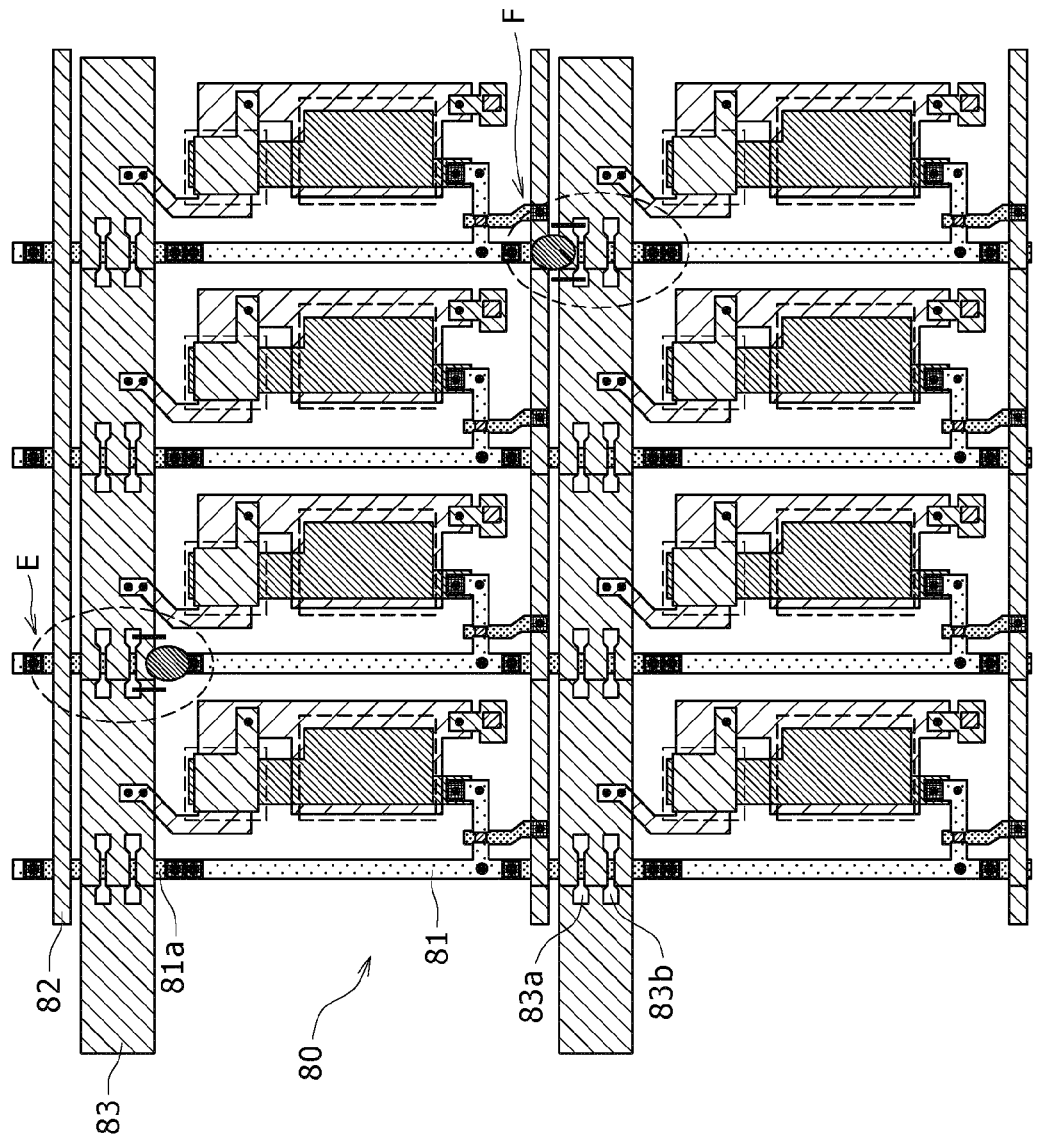
FIG. 11 is a plan view illustrating the wiring structure of an organic EL display according to a third embodiment as an example of the active matrix display device of the present invention.

FIG. 11 is a plan view illustrating the wiring structure of the organic EL display 80 according to the third embodiment of the present invention as an example of the active matrix display device.

As illustrated in FIG. 11, the organic EL display 80 has organic EL elements (not shown) arranged in a matrix of M rows by N columns (2 rows by 4 columns in FIG. 11 for simplification).

Here, the organic EL display 80 has a signal line 81 (corresponds to the first wiring in the present embodiment) disposed for each column of the organic EL elements. The organic EL display 80 also has a scan line 82 (corresponds to the first wiring in the present embodiment) disposed for each row of the organic EL elements and a power line 83 (corresponds to the first wiring in the present embodiment) disposed for each row thereof. The signal line 81 intersects the scan and power lines 82 and 83 at right angle. Further, the signal line 81 runs under the scan and power lines 82 and 83. (The signal line 81 is split where it intersects the scan and power lines 82 and 83. The split segments of the signal line 81 are joined together by a signal connection line 81a (corresponds to the second wiring in the present embodiment)). The signal connection line 81a is disposed in the underlying layer of the scan and power lines 82 and 83. As a result, a short circuit may develop at an intersection E between the signal and power lines 81 and 83 (intralayer short circuit between the end portion of the split segment of the signal line 81 and the side portion of the power line 83) as illustrated in FIG. 11.

At an intersection F, on the other hand, the scan line 82 disposed for each row (at the bottom of each row) of the organic EL elements and the power line 83 disposed for each row (on top of each row) thereof run parallel to each other in the same layer with a small spacing therebetween. The signal connection line 81a of the signal line 81 is disposed in the underlying layer of the scan and power lines 82 and 83. As a result, a short circuit may develop at the intersection F between the scan and power lines 82 and 83 (intralayer short circuit between the side portion of the scan line 82 and the side portion of the power line 83) as illustrated in FIG. 11.

Therefore, in the organic EL display 80 according to the third embodiment, the power line 83 is branched into three lines by slits 83a and 83b where the signal connection line 81a of the signal line 81 and the scan and power lines 82 and 83 overlap each other (intersections E and F) as illustrated in FIG. 11. If a short circuit is detected in the manufacturing process (inspection step) of the organic EL display 80 due, for example, to improper etching, the detected short-circuited area is cut off by laser irradiation from the surface, after which the short circuit is repaired to prevent line and other defects (bold portions at the intersections E and F). It should be noted that the slits 83a and 83b of the power line 83 in the organic EL display 80 according to the third embodiment differ from the rectangular slits 73a and 73b of the power line 73 in the organic EL display 70 according to the second embodiment illustrated in FIGS. 7 to 9 in that they are formed wider at their ends than at the intersection with the signal connection line 81a.

Figure 12A:
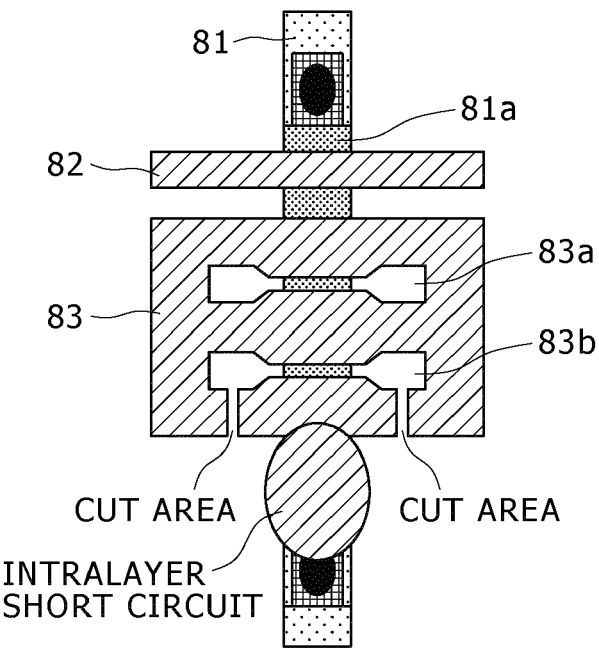
FIGS. 12A and 12B are plan views illustrating slits at the intersections between the signal line and scan and power lines in the organic EL display according to the third embodiment as an example of the active matrix display device of the present invention.
Figure 12B:
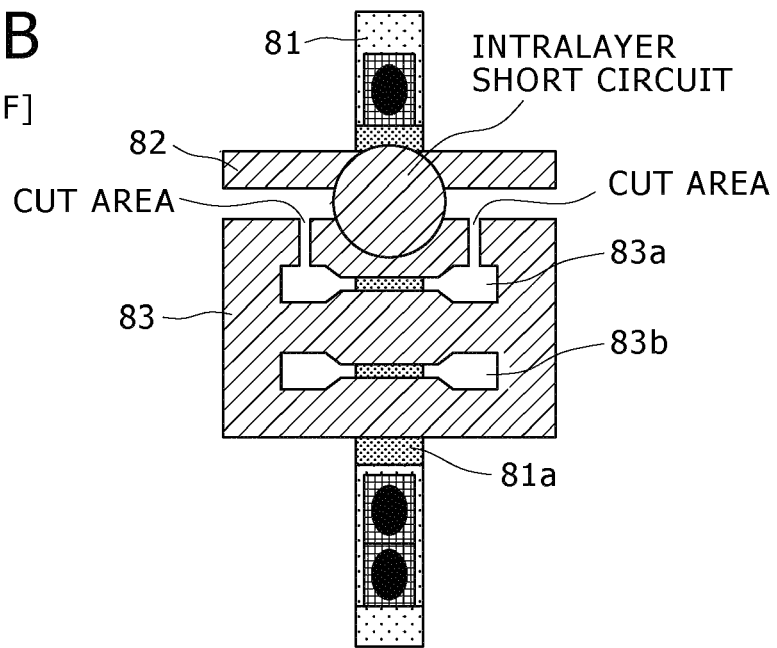

FIGS. 12A and 12B are plan views illustrating slits at the intersections E and F (intersections E and F illustrated in FIG. 11) between the signal line 81 and scan and power lines 82 and 83 in the organic EL display 80 according to the third embodiment of the present invention as an example of the active matrix display device.

As illustrated in FIGS. 12A and 12B, the power line 83 is branched into three lines at the intersections E and F by the slits 83a and 83b. Therefore, the power line 83 has three branch lines where it overlaps the signal connection line 81a. As a result, bypass lines are available in advance.

Here, if a short circuit develops on the signal connection line 81a corresponding to the second wiring between the signal line 81 corresponding to the first wiring and the portion of the power line 83 below the slit 83b as illustrated at the intersection E of FIG. 12A (intralayer short circuit between the end portion of the split segment of the signal line 81 and the side portion of the power line 83), the power line 83 is cut on both sides of the short-circuited area. As a result, the portion of the power line 83 below the slit 83b is no longer functional. However, the portion between the slits 83a and 83b and that above the slit 83a bypassing the short-circuited area serve as bypass lines. This means that the short circuit has been repaired.

On the other hand, if an intralayer short circuit develops on the signal connection line 81a between the scan line 82 and the portion of the power line 83 above the slit 83a as illustrated at the intersection F of FIG. 12B, the power line 83 is cut on both sides of the short-circuited area. As a result, the portion of the power line 83 above the slit 83a is no longer functional. However, the portion between the slits 83a and 83b and that below the slit 83b bypassing the short-circuited area serve as bypass lines. This means that the short circuit has been repaired.

In this case, the power line 83 is cut by laser cutting. The slits 83a and 83b are formed wider at their ends than at the intersection with the signal connection line 81a. That is, the slits to be laser-cut are widely open at their ends, thus permitting easy repair (laser cutting) of the short circuit. It should be noted that the slits 83a and 83b need only have the minimum width required for laser cutting at their ends. However, the slits are suitably about 3 μm (dependent, for example, upon the laser system) to 100 μm (dependent, for example, upon the image size) wide. The slits are 6 μm wide at their ends in the organic EL display 80 according to the third embodiment.

On the other hand, the slits 83a and 83b are narrower (have the minimum width) at the intersection with the signal connection line 81a than at their ends. More specifically, the slits are about 1 μm (dependent, for example, upon the patterning system) to 98 μm (dependent, for example, upon the exposure system) wide. The slits are 3.5 μm wide at the intersection in the organic EL display 80 according to the third embodiment.

The slits 83a and 83b are formed wide at their ends to prevent shading and crosstalk while at the same time permitting repair of a short circuit in an easy and quick manner. That is, the formation of the slits 83a and 83b leads to a higher resistance of the power line 83. However, the slits are formed wide at the ends required for the repair of a short circuit (laser cutting), and narrow at the intersection with the signal connection line 81a, thus providing a minimal increase in resistance of the power line 83. The voltage drop which increases with increasing distance from the power source can be suppressed, eliminating the problem of shading and crosstalk. This provides a high yield, delivering high image quality for the organic EL display 80.

Figure 13A:
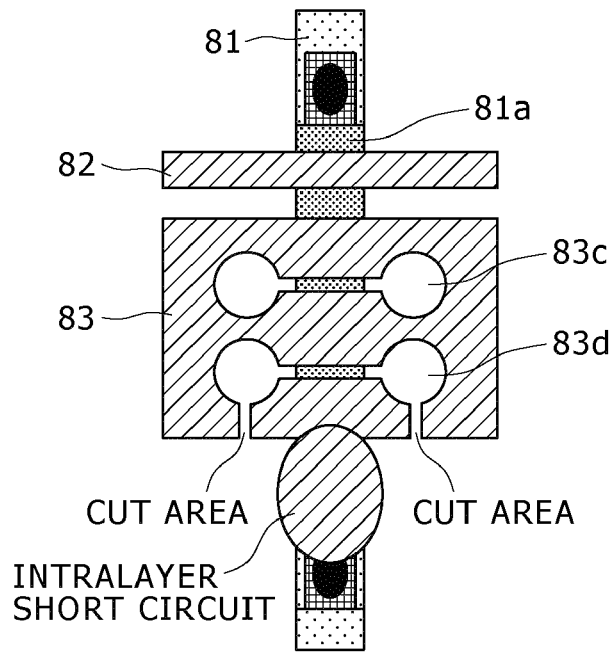
FIGS. 13A and 13B are plan views illustrating the slits in other forms at the intersections between the signal line and scan and power lines in the organic EL display according to the third embodiment as an example of the active matrix display device of the present invention.
Figure 13B:
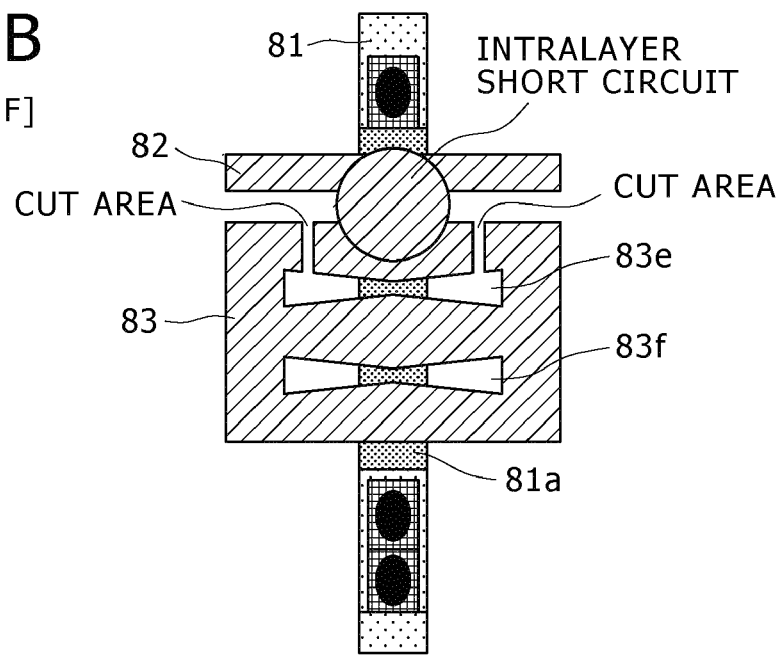

FIGS. 13A and 13B are plan views illustrating slit 83c (slit 83d) and slit 83e (slit 83f) in other forms at the intersections E and F (intersections E and F illustrated in FIG. 11) between the signal line 81 and scan and power lines 82 and 83 in the organic EL display 80 according to the third embodiment of the present invention as an example of the active matrix display device.

As illustrated in FIGS. 13A and 13B, the power line 83 is branched into three lines at the intersections E and F by the slit 83c (slit 83d) and 83e (slit 83f). Therefore, the power line 83 has three branch lines. As a result, bypass lines are available in advance.

Here, as illustrated in FIG. 13A, the slit 83c (slit 83d) is formed wider at its ends than at the intersection with the signal connection line 81a. However, the slit 83c (slit 83d) differs from the slit 83a (slit 83b) illustrated in FIGS. 11 and 12 in that it is circular at its ends. Even the slit 83c (slit 83d) formed in such a shape permits cutting (laser cutting) in an easy manner on both sides of the intralayer-short-circuited area. In addition, the slit 83c (slit 83d) is narrow at the intersection with the signal connection line 81a, suppressing the voltage drop and preventing shading and crosstalk.

On the other hand, the slit 83e (slit 83f) is also formed wider at its ends than at the intersection with the signal connection line 81a so that the openings thereof spreads out gradually from the intersection to its ends. Even the slit 83e (slit 83f) formed in such a shape permits cutting (laser cutting) in an easy manner on both sides of the intralayer-short-circuited area. In addition, the slit 83e (slit 83f) is narrow at the intersection with the signal connection line 81a, suppressing the voltage drop and preventing shading and crosstalk.

Incidentally, a wiring-to-wiring short circuit may develop between the signal and scan lines 81 and 82, in addition to an intralayer short circuit between the signal and power lines 81 and 83 (at the intersection E) and that between the scan and power lines 82 and 83 (at the intersection F). An intralayer short circuit between the signal and scan lines 81 and 82 is difficult to repair because laser cutting of the short-circuited area leads to disconnection of the signal or scan line 81 or 82. An interlayer short circuit between the signal connection and scan lines 81a and 82, which may also develop, is similarly difficult to repair.

Therefore, a description will be given next of an organic EL display 90 according to a fourth embodiment which permits repair of an intralayer short circuit between the signal and scan lines 81 and 82 and interlayer short circuit between the signal connection and scan lines 81a and 82.

Figure 14:
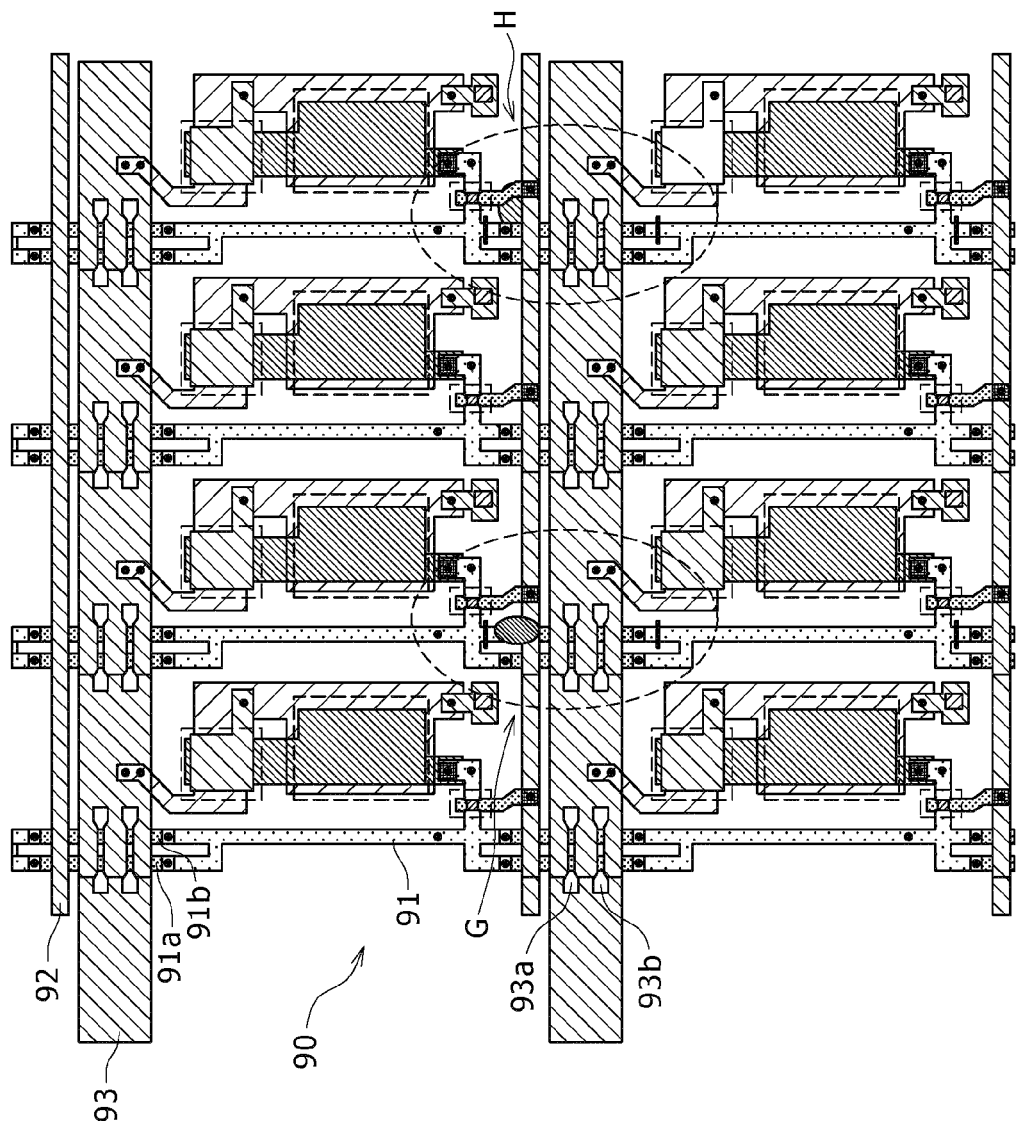
FIG. 14 is a plan view illustrating the wiring structure of an organic EL display according to a fourth embodiment as an example of the active matrix display device of the present invention.

FIG. 14 is a plan view illustrating the wiring structure of the organic EL display 90 according to the fourth embodiment as an example of the active matrix display device of the present embodiment.

As illustrated in FIG. 14, the organic EL display 90 has organic EL elements (not shown) arranged in a matrix of M rows by N columns (2 rows by 4 columns in FIG. 14 for simplification).

Here, the organic EL display 90 has a signal line (corresponds to the first wiring in the present embodiment) disposed for each column of the organic EL elements. The organic EL display 90 also has a scan line (corresponds to the first wiring in the present embodiment) disposed for each row of the organic EL elements and a power line 93 (corresponds to the first wiring in the present embodiment) disposed for each row thereof. The signal line 91 intersects the scan and power lines 92 and 93 at right angle. Further, the signal line runs under the scan and power lines 92 and 93. (The signal line 91 is branched into two lines first and then each is split where the signal line 91 intersects the scan and power lines 92 and 93. The split segments of the branch lines of the signal line 91 are joined together by a signal connection line 91a (corresponds to the second wiring in the present embodiment) and a signal connection line 91b (corresponds to the second wiring in the present embodiment).The signal connection lines 91a and 91b are disposed in the underlying layer of the scan and power lines 92 and 93.)

As described above, in the organic EL display 90 according to the fourth embodiment, the signal line 91 is branched into two lines. The split segments of the respective branch lines are joined together by the signal connection lines 91a and 91b. Therefore, the signal line 91 has two branch lines (signal connection lines 91a and 91b). As a result, bypass lines are available in advance. If an intralayer short circuit is detected between the signal and scan lines 91 and 92 (intersection G) or between the signal connection line 91b and scan line 92

(connection line to the TFT) (intersection H) in the manufacturing process (inspection step) of the organic EL display 90, the detected short-circuited area is cut off by laser irradiation from the surface, after which the short circuit is repaired to prevent line and other defects (bold portions at the intersections G and H). It should be noted that, at the intersection G, there is an intralayer short circuit between the wirings formed in the overlying layer of the gate insulating film 32 (refer to FIG. 8). At the intersection H, on the other hand, there is an intralayer short circuit between the wirings formed in the underlying layer of the gate insulating film 32.

Figure 15A:
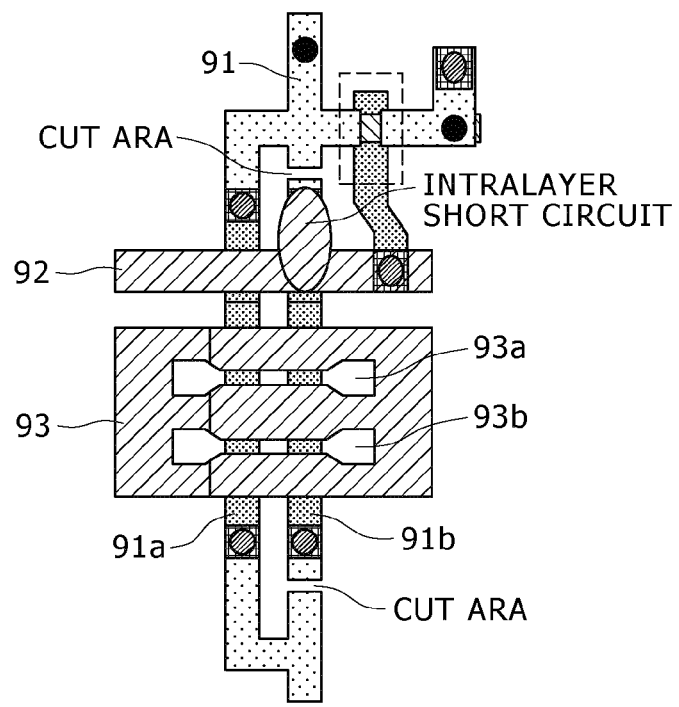
FIGS. 15A and 15B are plan view illustrating signal connection lines at the intersections between the signal and scan lines in the organic EL display according to the fourth embodiment as an example of the active matrix display device of the present invention.
Figure 15B:
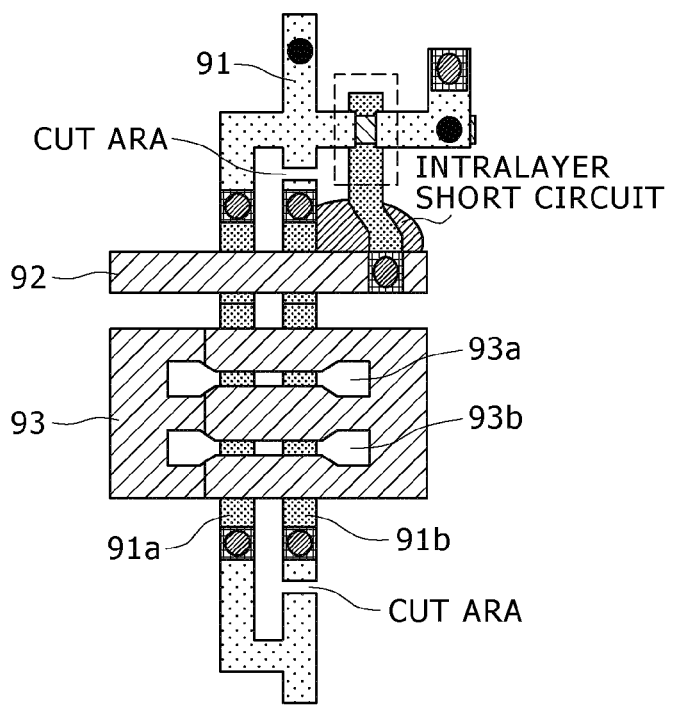

FIGS. 15A and 15B are plan view illustrating the signal connection lines 91a and 91b at the intersections G and H (intersections G and H illustrated in FIG. 14) between the signal and scan lines 91 and 92 in the organic EL display 90 according to the fourth embodiment as an example of the active matrix display device of the present invention.

As illustrated in FIGS. 15A and 15B, the signal line 91 is branched into two lines at the intersections G and H. The split segments of the respective branch lines are joined together by the signal connection lines 91a and 91b. It should be noted that the signal and scan lines 91 and 92 are formed in the overlying layer of the gate insulating film 32 (refer to FIG. 8), and the signal connection lines 91a and 91b in the underlying layer of the same film 32.

Here, if an intralayer short circuit develops between the signal line 91 or signal connection line 91b and scan line 92 as illustrated at the intersections G and H, it is only necessary to cut the signal connection line 91b, i.e., one of the two branch lines of the signal line 91. As a result, the signal connection line 91b cut on both sides of the short-circuited area is no longer functional. However, the signal connection line 91a serves as a bypass line. This means that the intralayer short circuit has been repaired. It should be noted that the signal connection line 91b serves as a bypass line in the event of an intralayer short circuit in the signal connection line 91a.

As described above, the two branch lines, i.e., the signal connection lines 91a and 91b, permit repair of an intralayer short circuit between the signal and scan lines 91 and 92 due, for example, to improper etching. That is, at the intersection G illustrated in FIG. 15A, there is an intralayer short circuit between the wirings formed in the overlying layer of the gate insulating film 32 (refer to FIG. 8). This short circuit can be repaired by laser-cutting the signal line 91 on the side of the signal connection line 91b. Further, at the intersection H illustrated in FIG. 15B, there is an intralayer short circuit between the wirings formed in the underlying layer of the gate insulating film 32. This short circuit can also be repaired by laser-cutting the signal line 91 on the side of the signal connection line 91b.

Moreover, branching of the signal line 91 into two lines provides two holes for connection between the signal line 91 and signal connection lines 91a and 91b. Therefore, even if either of the two connection holes is not open due, for example, to improper etching and therefore the two lines cannot be joined, connection thereof can be accomplished using the remaining line, thus avoiding an improper connection of the signal line 91.

Figure 16A:
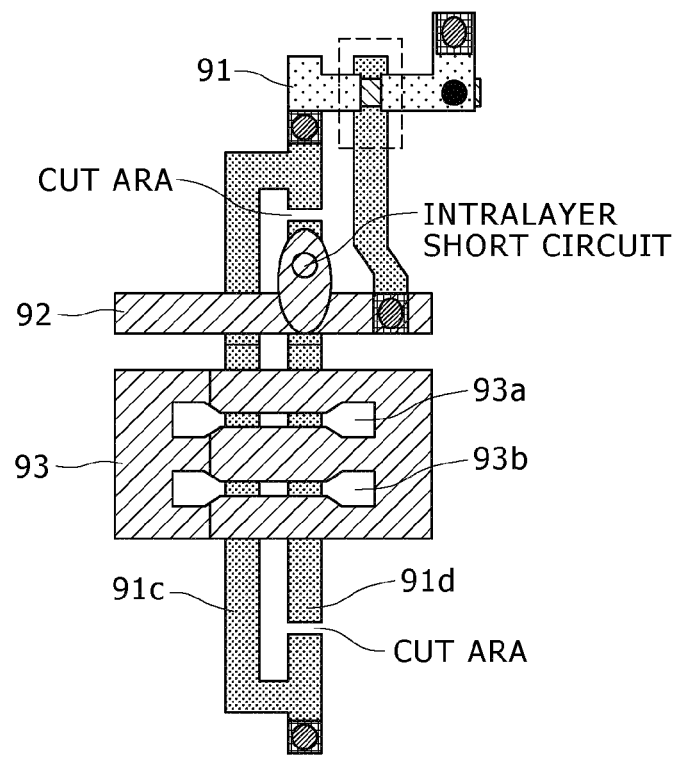
FIGS. 16A and 16B are plan views illustrating other signal connection lines at the intersections between the signal and scan lines in the organic EL display according to the fourth embodiment as an example of the active matrix display device of the present invention.
Figure 16B:
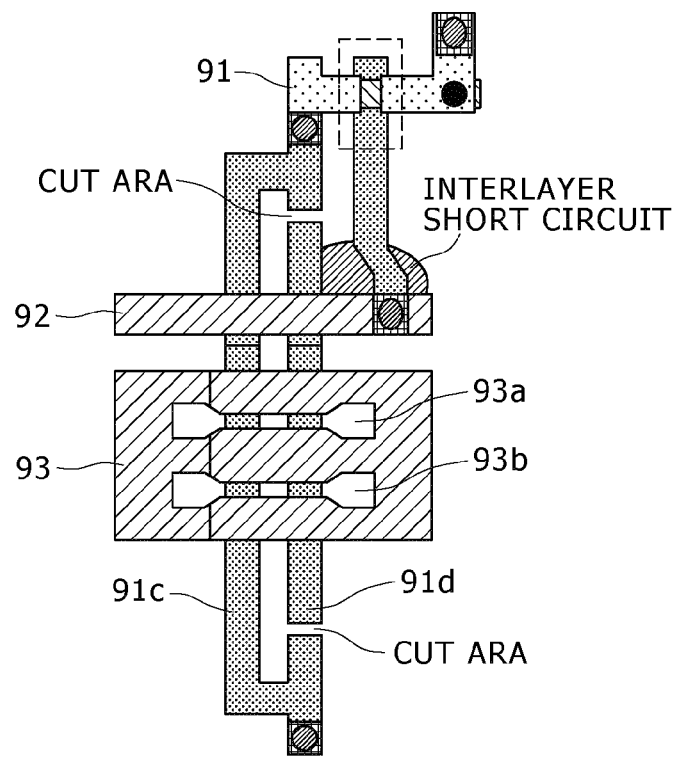
Figure 17:
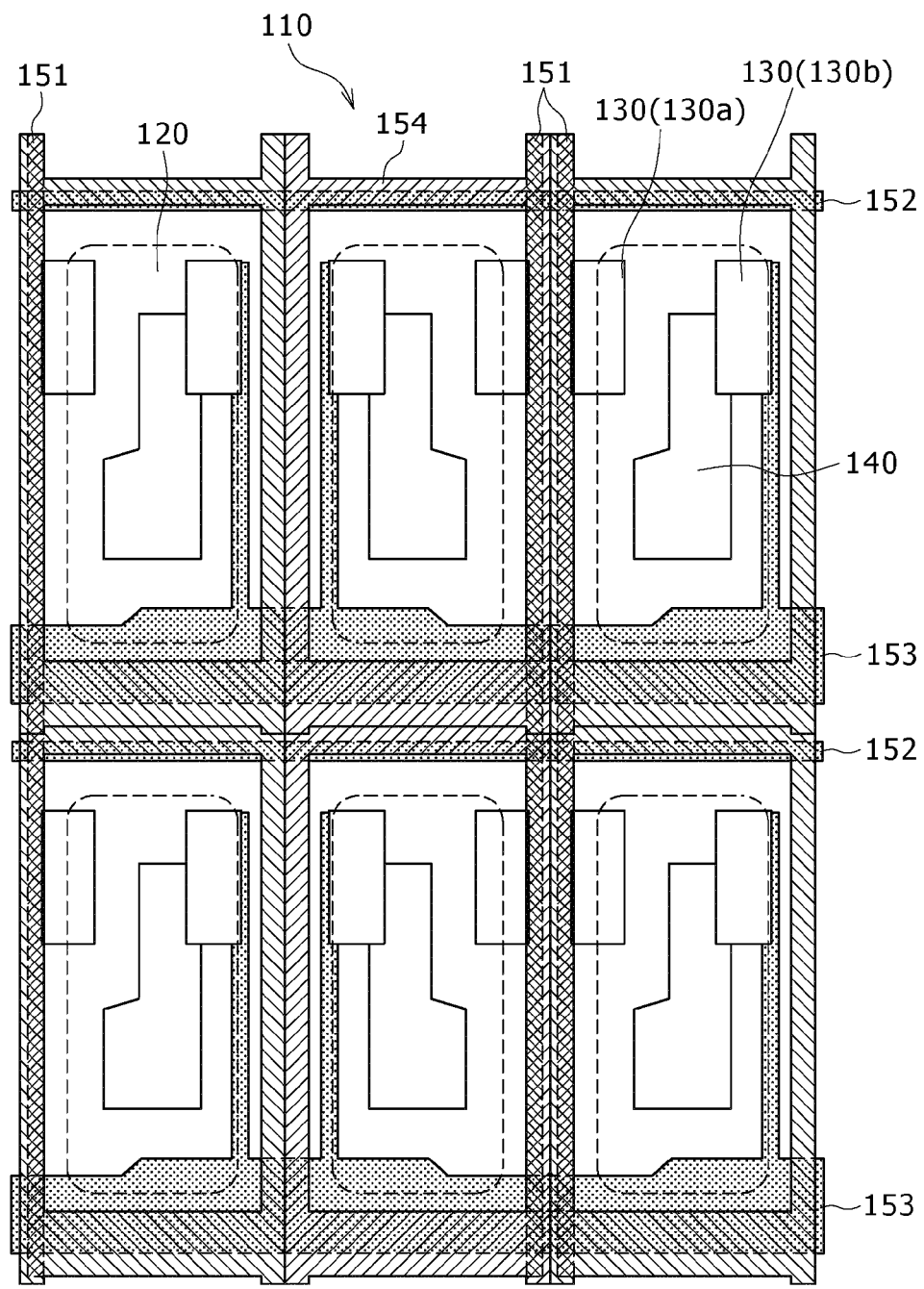
FIG. 17 is a plan view illustrating a reference example of the wiring structure of the organic EL display.

FIGS. 16A and 16B are plan views illustrating other signal connection lines 91c (corresponds to the second wiring in the present embodiment) and 91d (corresponds to the second wiring in the present embodiment) at the intersections G and H (intersections G and H illustrated in FIG. 14) between the signal and scan lines 91 and 92 in the organic EL display 90 according to the fourth embodiment as an example of the active matrix display device of the present invention.

As illustrated in FIGS. 16A and 16B, the split segments of the signal line 91 are joined together by a signal connection line which is branched into the signal connection lines 91c and 91d.

Here, if an interlayer short circuit develops between the signal connection line 91d and scan line 92 as illustrated at the intersection G of FIG. 16A or an intralayer short circuit develops between the signal connection line 91d and scan line 92 (connection line to the TFT) as illustrated at the intersection H of FIG. 16B, it is only necessary to cut the signal connection line 91d. As a result, the signal connection line 91d cut on both sides of the short-circuited area is no longer functional. However, the signal connection line 91c, which is the other branch line, serves as a bypass line. This means that the interlayer short circuit at the intersection G or intralayer short circuit at the intersection H has been repaired. It should be noted that the signal connection line 91d serves as a bypass line in the event of an interlayer or intralayer short circuit in the signal connection line 91c.

As described above, a bypass line can be formed only at the intersections with the scan and power lines 92 and 93 by using a signal connection line which is branched into the signal connection lines 91c and 91d rather than entirely branching the signal line 91. This prevents increase in metal area in the organic EL display 90, ensuring improved yield and providing more leeway in the layout of other components.

Despite the above-described embodiments, the present invention is not limited thereto but may be modified in many other ways including the following:

(1) In the above embodiments, the scan line 52 and signal line 51 are branched into two lines, and the power line 53 and other lines into three lines. However, the number of branch lines is not limited thereto.

(2) In the above embodiments, the scan and power lines 52 and 53 are branched, for example, at the intersections with the signal line 51. At the intersections with the auxiliary wiring 54, however, it is only necessary to branch only one or more of the signal, scan and power lines 51, 52 and 53 and auxiliary wiring 54. That is, it is only necessary to ensure that bypass lines are available in advance according to the wiring and other conditions at the intersections.

(3) In the above embodiments, a description has been given of a top emission display designed to extract light, emitted by the organic EL element 20 (light-emitting element), from the side opposite to the substrate 11. However, the present invention is also applicable to a bottom emission display designed to extract light, emitted by the organic EL element 20 (light-emitting element), from the same side as the substrate 11.

(4) In the above embodiments, the a-Si (amorphous silicon) layer 33 is used, for example, for the TFTs 30 (TFT 30a and TFT 30b). However, a low-temperature poly-Si (low-temperature polysilicon), oxide semiconductor or other material may be used for the TFTs 30. Further, in the above embodiments, the organic EL elements (organic electroluminescence elements) 20 are used as light-emitting elements. However, wide-ranging light-emitting elements such as inorganic electroluminescence elements or light-emitting diodes may be used so long as a light-emitting layer can be formed between the upper and lower electrodes.

What is claimed is:
1. An active matrix display device comprising:
   driving means provided on a substrate;
   an insulating film stacked on the substrate; and
   light-emitting elements arranged in a matrix on the insulating film, and each of the light-emitting elements includes an light-emitting layer between its upper and lower electrodes;

the active matrix display device being driven by the driving means provided for each of the light-emitting elements, the active matrix display device also including a first wiring required to cause the light-emitting element to emit light, and a second wiring disposed in an underlying layer of the first wiring via the insulating film, the second wiring also required to cause the light-emitting element to emit light, wherein the first or second wiring is branched into a plurality of wirings at an intersection between the two wirings, wherein, the first wiring is a signal line disposed for each column, scan line disposed for each row or power line disposed for each row of the light-emitting elements arranged in the matrix, and the second wiring is a signal connection line adapted to connect split segments of the signal line split where the signal line intersects the scan and power lines.

2. The active matrix display device of claim 1, wherein the light emitting elements are organic electroluminescence elements including an organic substance layer.

3. The active matrix display device of claim 1, wherein the first wiring is provided on the same layer as the lower electrode of the light-emitting element and is an auxiliary wiring adapted to adjust the electrical resistance of the upper electrode.

4. The active matrix display device of claim 1, wherein the first wiring is provided on the same layer as the lower electrode of the light-emitting element and is an auxiliary wiring adapted to adjust the electrical resistance of the upper electrode, and the auxiliary wiring is disposed around the light-emitting element and connected to the upper electrode to reduce the electrical resistance of the upper electrode.

5. The active matrix display device of claim 1, wherein the first or second wiring is branched by a slit at the intersection between the first and second wirings.

6. The active matrix display device of claim 1, wherein the first or second wiring is branched by a slit at the intersection between the first and second wirings, and the slit is formed wider at its ends than at the intersection between the first and second wirings.

7. The active matrix display device of claim 1, wherein the first wiring is a power line of the light-emitting element, the power line is branched by a slit at the intersection between the power line and the second wiring, and the slit is formed wider at its ends than at the intersection between the power line and the second wiring.

8. The active matrix display device of claim 1, wherein the first or second wiring is branched by a bypass line at the intersection between the first and second wirings.

9. The active matrix display device of claim 1, wherein the first wiring is a scan line of the light-emitting element, and the scan line is branched by a bypass line at the intersection between the scan line and the second wiring.

10. The active matrix display device of claim 1, wherein the first wiring is a signal line of the light-emitting element, and the signal line is branched by a bypass line at the intersection between the signal line and the second wiring.

11. The active matrix display device of claim 1, wherein the first wirings are a signal line disposed for each column, scan line disposed for each row and power line disposed for each row of the light-emitting elements arranged in the matrix, the second wiring is the signal connection line adapted to connect split segments of the signal line split where the signal line intersects the scan and power lines, and the signal connection line is branched by a bypass line at the intersection between the signal line and the scan and power lines.

12. An organic electroluminescence (EL) display device comprising:

driving means provided on a substrate;

an insulating film stacked on the substrate; and light-emitting elements arranged in a matrix on the insulating film, and each of the light-emitting elements includes an light-emitting layer between its upper and lower electrodes;

the organic EL display device being driven by the driving means provided for each of the light-emitting elements, the organic EL display device also including a first wiring required to cause the light-emitting element to emit light, and a second wiring disposed in an underlying layer of the first wiring via the insulating film, the second wiring also required to cause the light-emitting element to emit light, wherein the first or second wiring is branched into a plurality of wirings at an intersection between the two wirings, wherein, the first wiring is a signal line disposed for each column, scan line disposed for each row or power line disposed for each row of the light-emitting elements arranged in a matrix, and the second wiring is a signal connection line adapted to connect split segments of the signal line split where the signal line intersects the scan and power lines.

13. The organic EL display device of claim 12, wherein the light emitting elements are organic electroluminescence elements including an organic substance layer.

14. The organic EL display device of claim 12, wherein the first wiring is provided on the same layer as the lower electrode of the light-emitting element and is an auxiliary wiring adapted to adjust the electrical resistance of the upper electrode.

15. The organic EL display device of claim 12, wherein the first wiring is provided on the same layer as the lower electrode of the light-emitting element and is an auxiliary wiring adapted to adjust the electrical resistance of the upper electrode, and the auxiliary wiring is disposed around the light-emitting element and connected to the upper electrode to reduce the electrical resistance of the upper electrode.

16. The organic EL display device of claim 12, wherein the first or second wiring is branched by a slit at the intersection between the first and second wirings.

17. The organic EL display device of claim 12, wherein the first or second wiring is branched by a slit at the intersection between the first and second wirings, and the slit is formed wider at its ends than at the intersection between the first and second wirings.

18. The organic EL display device of claim 12, wherein the first wiring is a power line of the light-emitting element, the power line is branched by a slit at the intersection between the power line and the second wiring, and the slit is formed wider at its ends than at the intersection between the power line and the second wiring.

19. The organic EL display device of claim 12, wherein the first or second wiring is branched by a bypass line at the intersection between the first and second wirings.

20. The organic EL display device of claim 12, wherein the first wiring is a scan line of the light-emitting element, and the scan line is branched by a bypass line at the intersection between the scan line and the second wiring.

21. The organic EL display device of claim 12, wherein the first wiring is a signal line of the light-emitting element, and the signal line is branched by a bypass line at the intersection between the signal line and the second wiring.

22. The organic EL display device of claim 12, wherein the first wirings are a signal line disposed for each column, scan line disposed for each row and power line disposed for each row of the light-emitting elements arranged in the matrix, the second wiring is the signal connection line adapted to connect split segments of the signal line split where the signal line intersects the scan and power lines, and the signal connection line is branched by a bypass line at the intersection between the signal line and the scan and power lines.

* * * * *